US010666420B1

(12) United States Patent
Bogdan

(10) Patent No.: US 10,666,420 B1
(45) Date of Patent: May 26, 2020

(54) TIME PROCESSING TECHNOLOGY

(71) Applicant: John W Bogdan, Ottawa (CA)

(72) Inventor: John W Bogdan, Ottawa (CA)

(73) Assignee: John W. Bogdan, Ottawa, Ontario (CA)

( * ) Notice: Subject to any disclaimer, the term of this patent is extended or adjusted under 35 U.S.C. 154(b) by 0 days.

(21) Appl. No.: 16/558,152

(22) Filed: Sep. 1, 2019

(51) Int. Cl.
*H04L 7/08* (2006.01)

(52) U.S. Cl.
CPC ....................... *H04L 7/08* (2013.01)

(58) Field of Classification Search
CPC ........................................................ H04L 7/08
See application file for complete search history.

(56) References Cited

U.S. PATENT DOCUMENTS

| 2005/0156009 A1* | 7/2005 | Gazlay | B25C 1/04 227/130 |
| 2009/0244375 A1* | 10/2009 | Moehlmann | H03L 7/087 348/512 |
| 2013/0093471 A1* | 4/2013 | Cho | H03L 7/081 327/107 |

* cited by examiner

*Primary Examiner* — Ted M Wang

(57) ABSTRACT

A Time Processing Technology (TPT) disclosed herein is contributing methods, systems and circuits for filtering out a phase noise of a timing referencing signal and producing a timing implementing signal from a free running local clock or its subclocks wherein the filtering out the phase noise is implemented with an open loop system (OLS) or a closed loop system (CLS) of phase control, wherein TPT comprises and is enabled by contributed herein a time to digital converter (TDC), a rational number filter (RNF) and a digital to time converter (DTC), securing improved resolution and open loop operations of phase control systems.

3 Claims, 17 Drawing Sheets

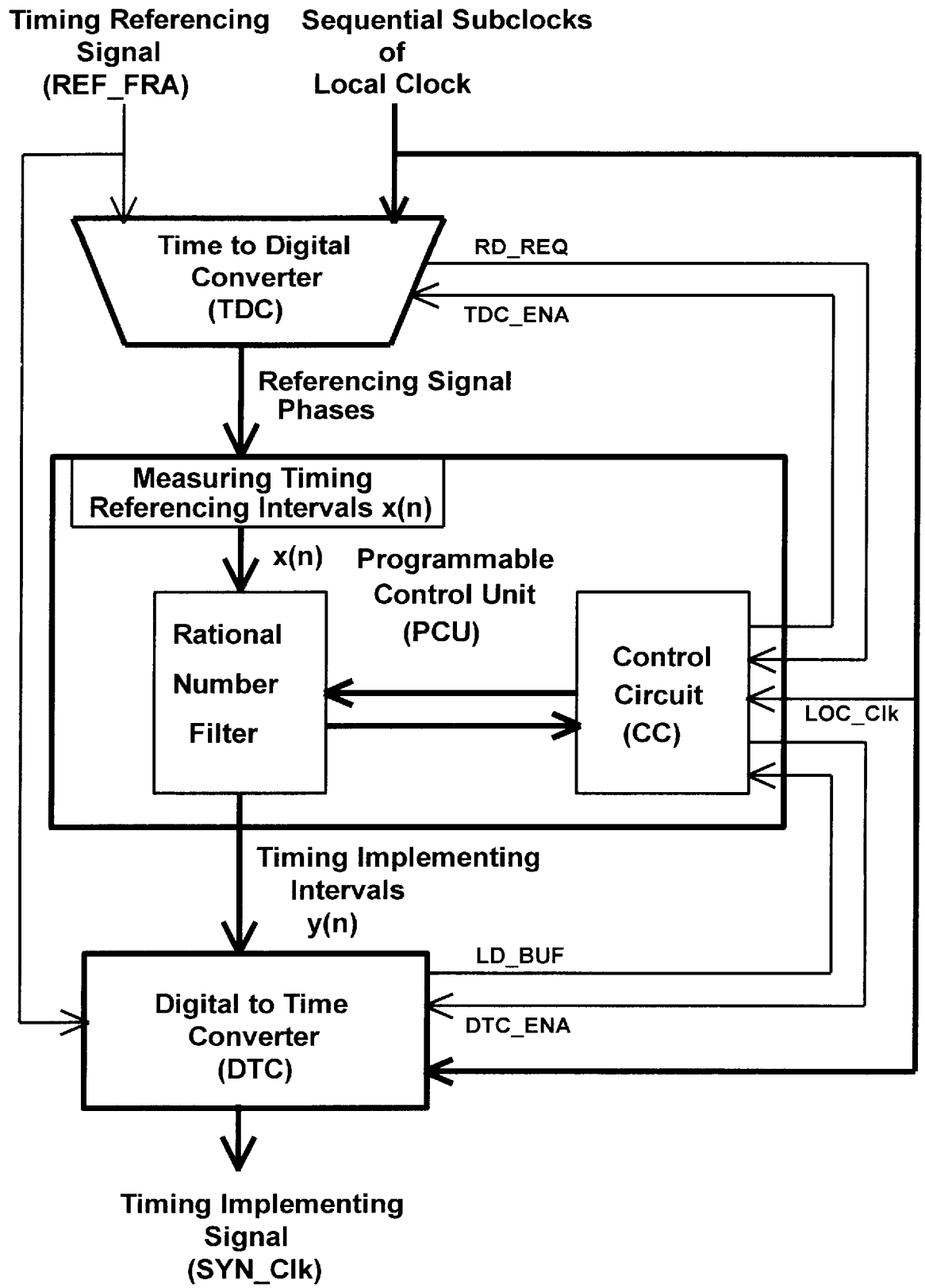
FIG.1A Time Processing System

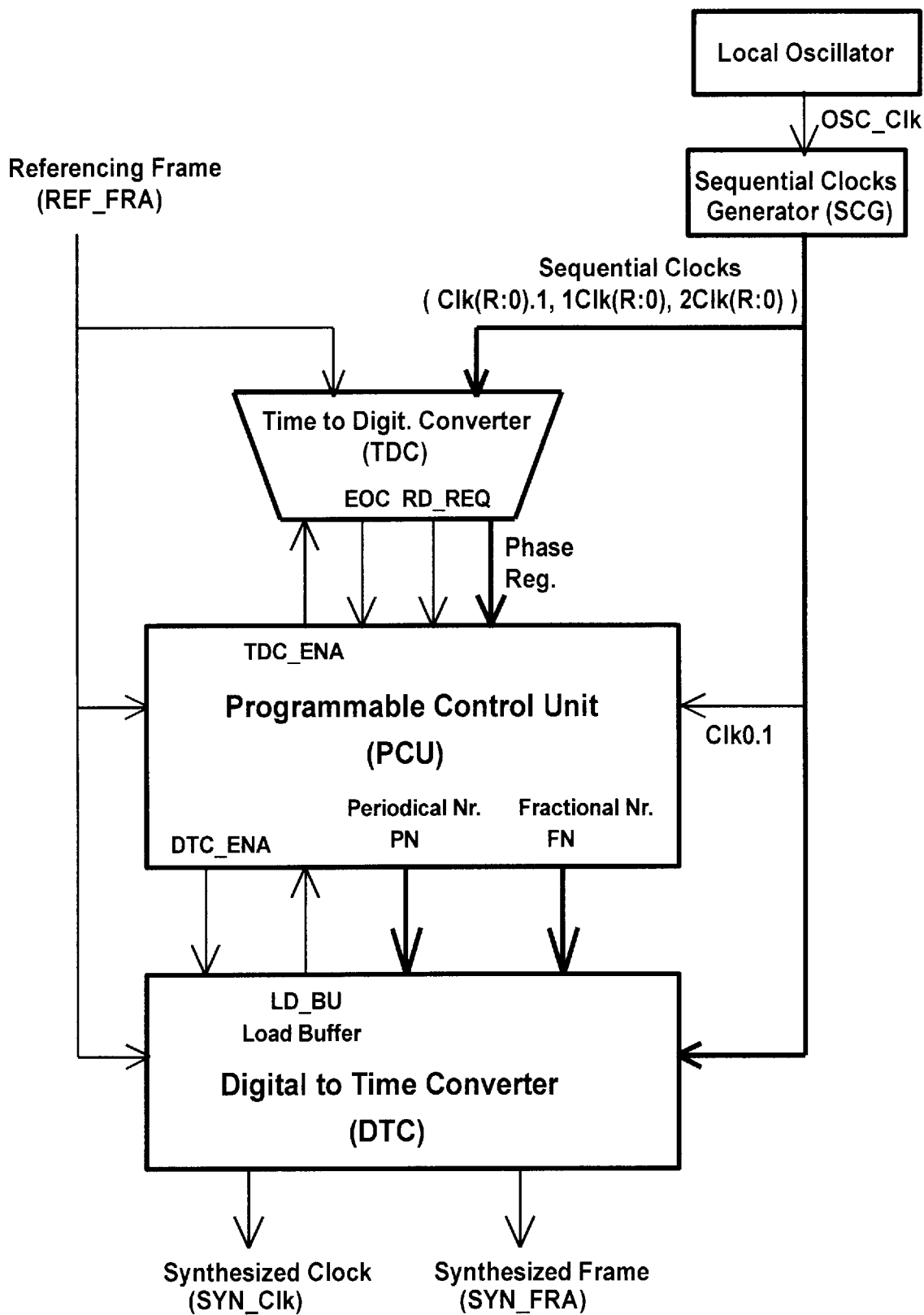
FIG.1B Reducing Phase Noise of Phase Tracking System

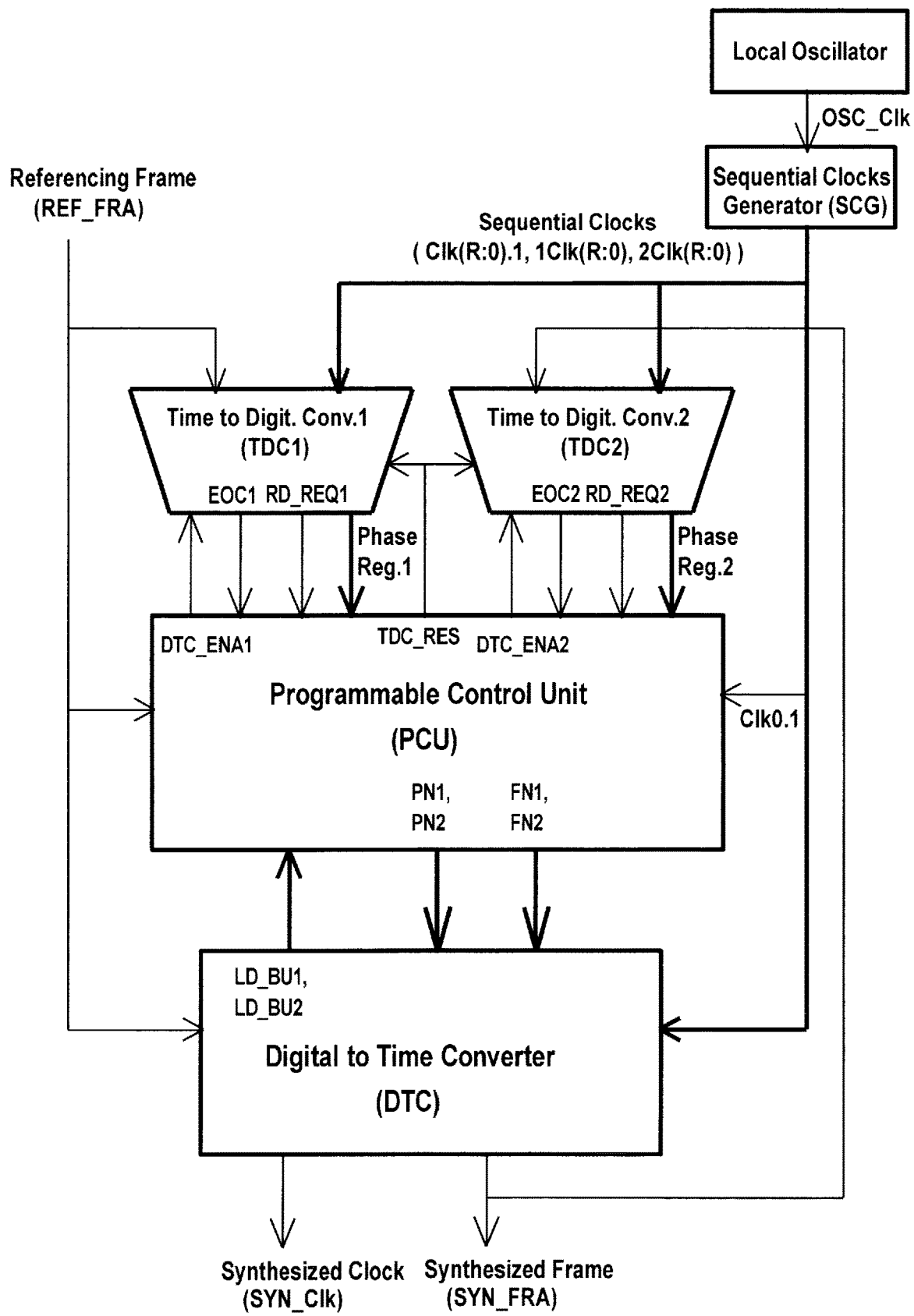
FIG.1C Phase Transferring Configuration

FIG.2A Frequency Response of the FIR Filter
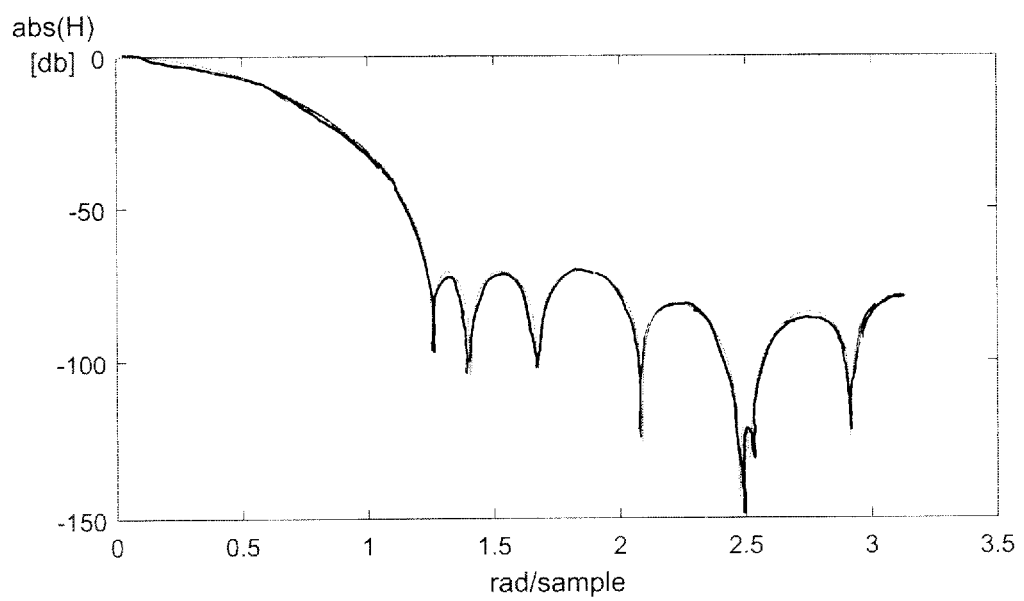

FIG.2B Rational Number Filter implementing the FIR Filter
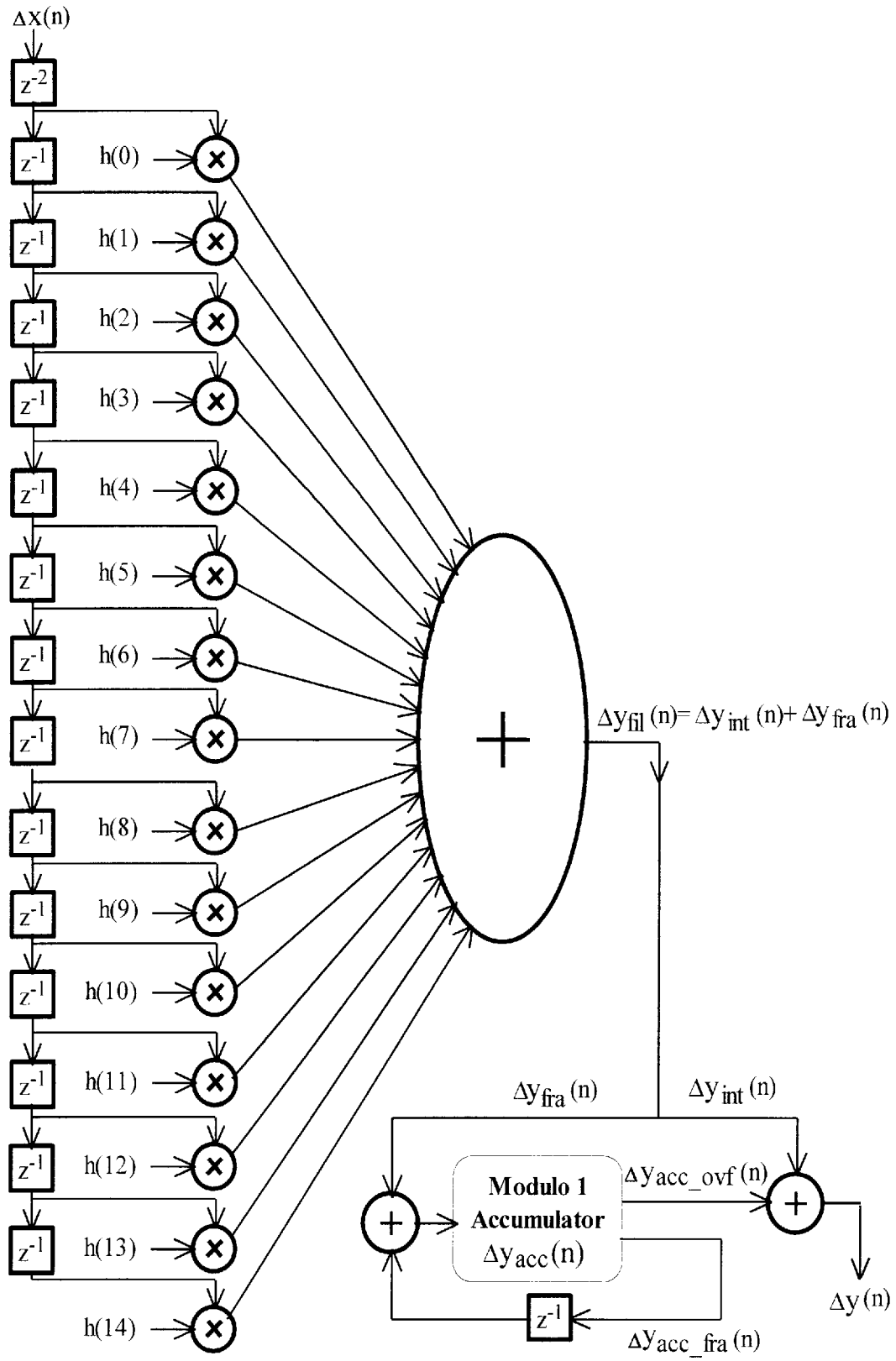

FIG.2C Frequency Response of the IIR Filter
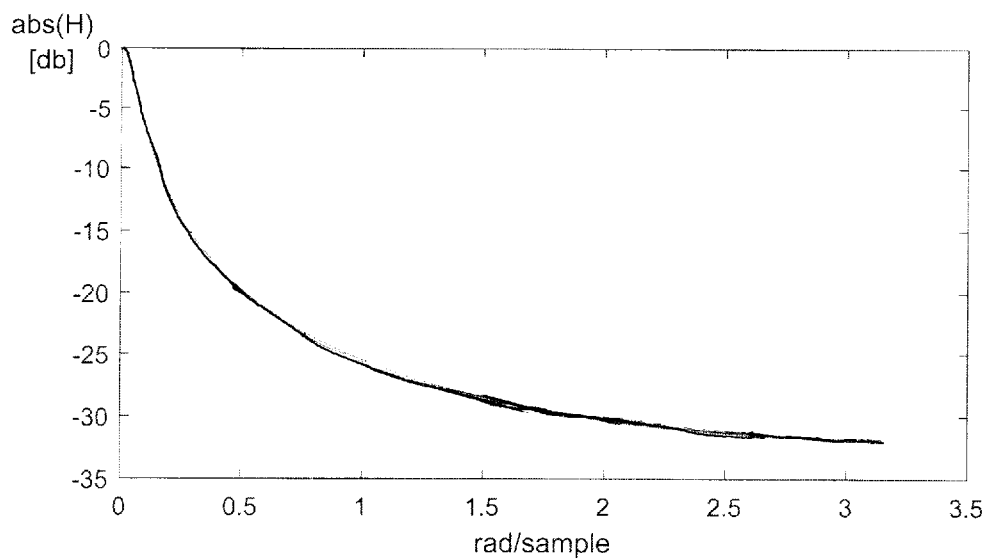

FIG.2D  Rational Number Filter approximating the IIR Filter
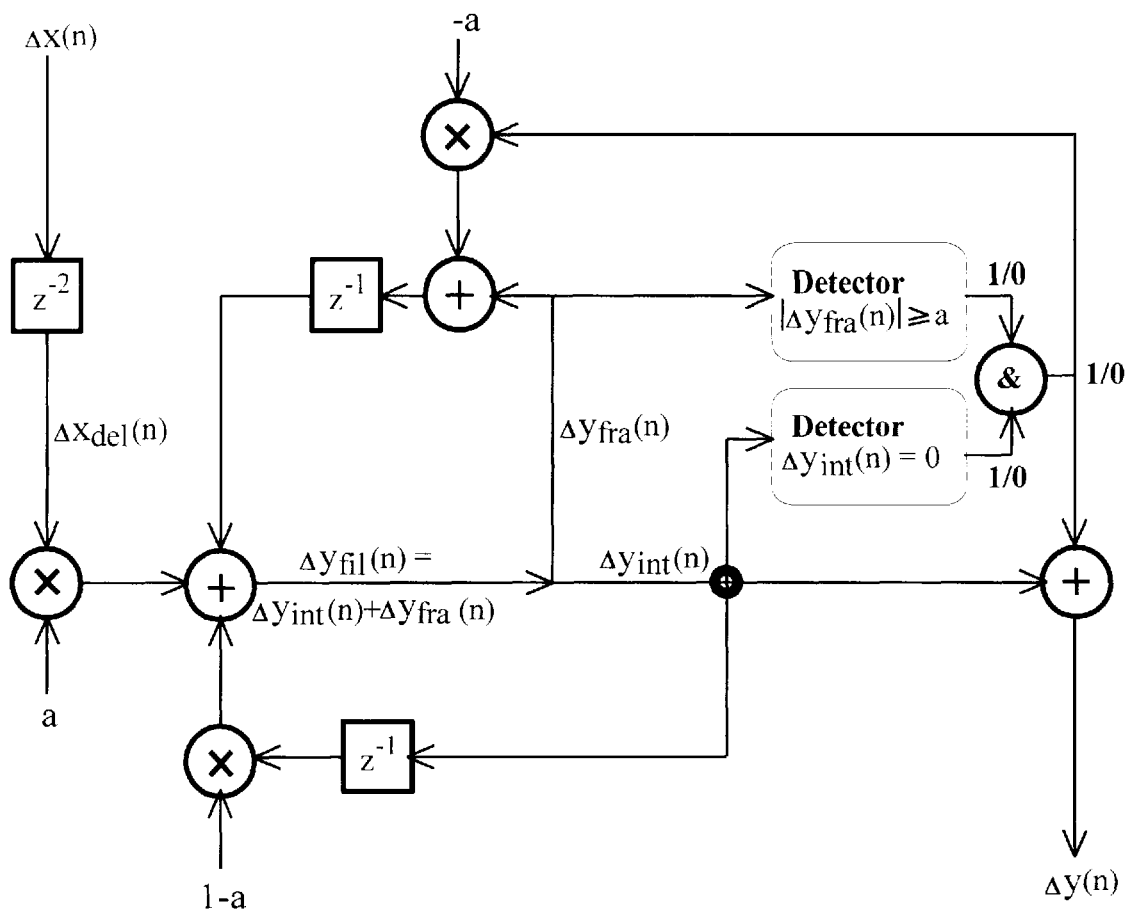

FIG.2E Impulse Response of the RNF approximating IIR  (a = 0.05 , $\Delta x_{imp}(0) = 50$)

| n | $(1-a)\Delta y_{int}(n-1)$ | $\Delta y_{fra}(n-1)$ | $\Delta y_{fil}(n)$ | Sum of $\Delta y(n)$ | Descriptions of Transitional Steps |
|---|---|---|---|---|---|
| 0 |  |  | 2.5 | 2 | Application of $\Delta x_{imp}(0)=50$ |
| 1 | 1.9 | 0.5 | 2.4 | 4 |  |
| 2 | 1.9 | 0.4 | 2.3 | 6 |  |
| 3 | 1.9 | 0.3 | 2.2 | 8 |  |
| 4 | 1.9 | 0.2 | 2.1 | 10 |  |
| 5 | 1.9 | 0.1 | 2 | 12 |  |
| 6 | 1.9 | 0 | 1.9 | 13 |  |
| 7 | 0.95 | 0.9 | 1.85 | 14 |  |
| 8 | 0.95 | 0.85 | 1.8 | 15 |  |
| 9 | 0.95 | 0.8 | 1.75 | 16 |  |
| 10 | 0.95 | 0.75 | 1.7 | 17 |  |
| 11 | 0.95 | 0.7 | 1.65 | 18 |  |
| 12 | 0.95 | 0.65 | 1.6 | 19 |  |
| 13 | 0.95 | 0.6 | 1.55 | 20 |  |
| 14 | 0.95 | 0.55 | 1.5 | 21 |  |
| 15 | 0.95 | 0.5 | 1.45 | 22 |  |
| 16 | 0.95 | 1.45 | 1.4 | 23 |  |
| 17 | 0.95 | 0.4 | 1.35 | 24 |  |
| 18 | 0.95 | 0.35 | 1.3 | 25 |  |
| 19 | 0.95 | 0.3 | 1.25 | 26 |  |
| 20 | 0.95 | 0.25 | 1.2 | 27 |  |
| 21 | 0.95 | 0.2 | 1.15 | 28 |  |
| 22 | 0.95 | 0.15 | 1.1 | 29 |  |
| 23 | 0.95 | 0.1 | 1.05 | 30 |  |
| 24 | 0.95 | 0.05 | 1 | 31 | Last of IIR responses outputting $\Delta y(n) = \Delta y_{int} > 0$ |
| 25 | 0.95 | 0 | 0.95 | 32 | First of RNF responses forcing $\Delta y(n) = 1$ |
| 26 | 0 | 0.9 | 0.9 | 33 |  |
| 27 | 0 | 0.85 | 0.8 | 34 |  |
| etc. |  |  |  |  |  |
| 43 | 0 | 0.05 | 0.05 | 50 | Last of RNF responses forcing $\Delta y(n) = 1$ |
| 44 | 0 | 0 | 0 | 50 |  |

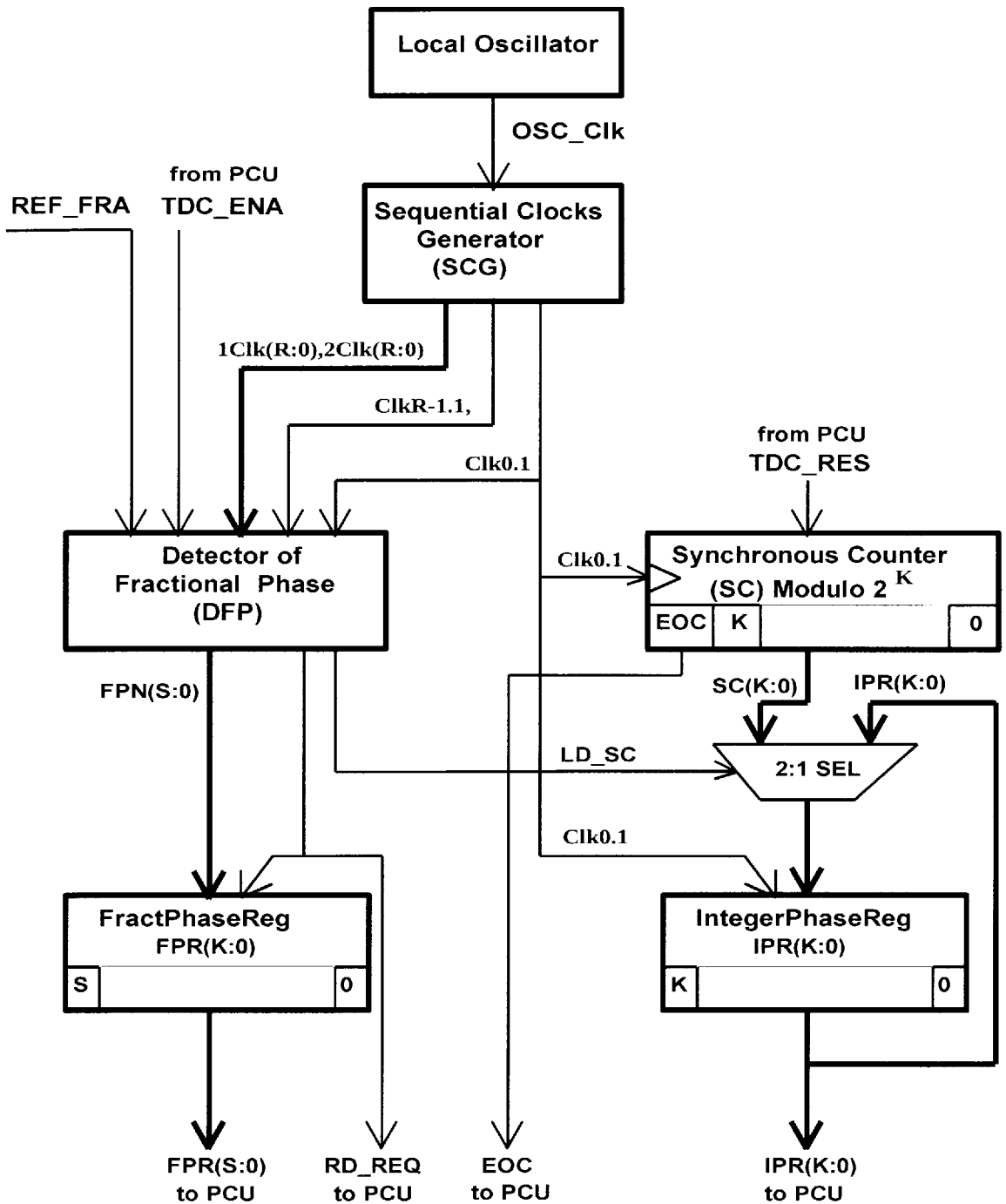
FIG.3A Time to Digital Converter (TDC)

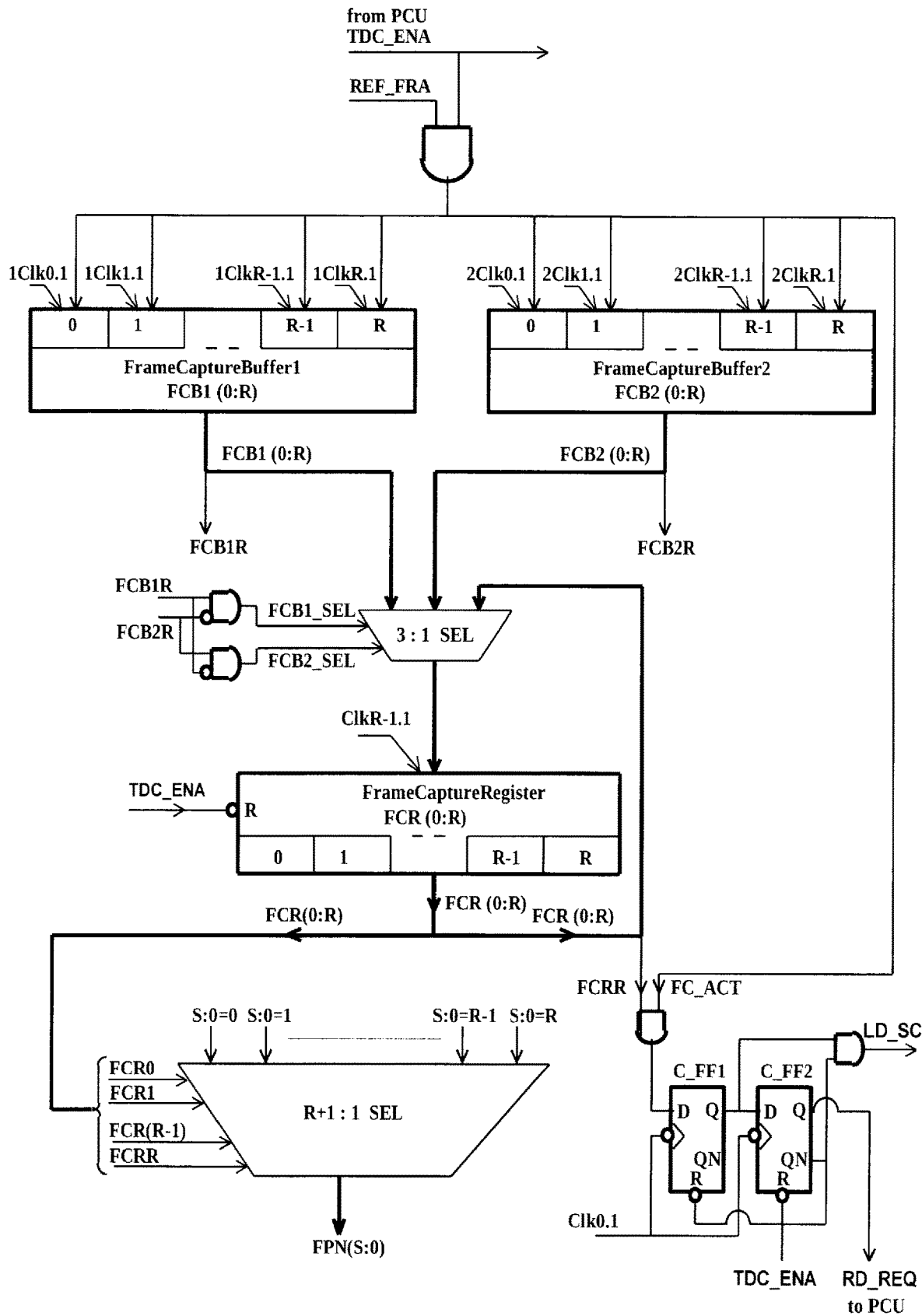
FIG.3B Detector of Fractional Phase (DFP)

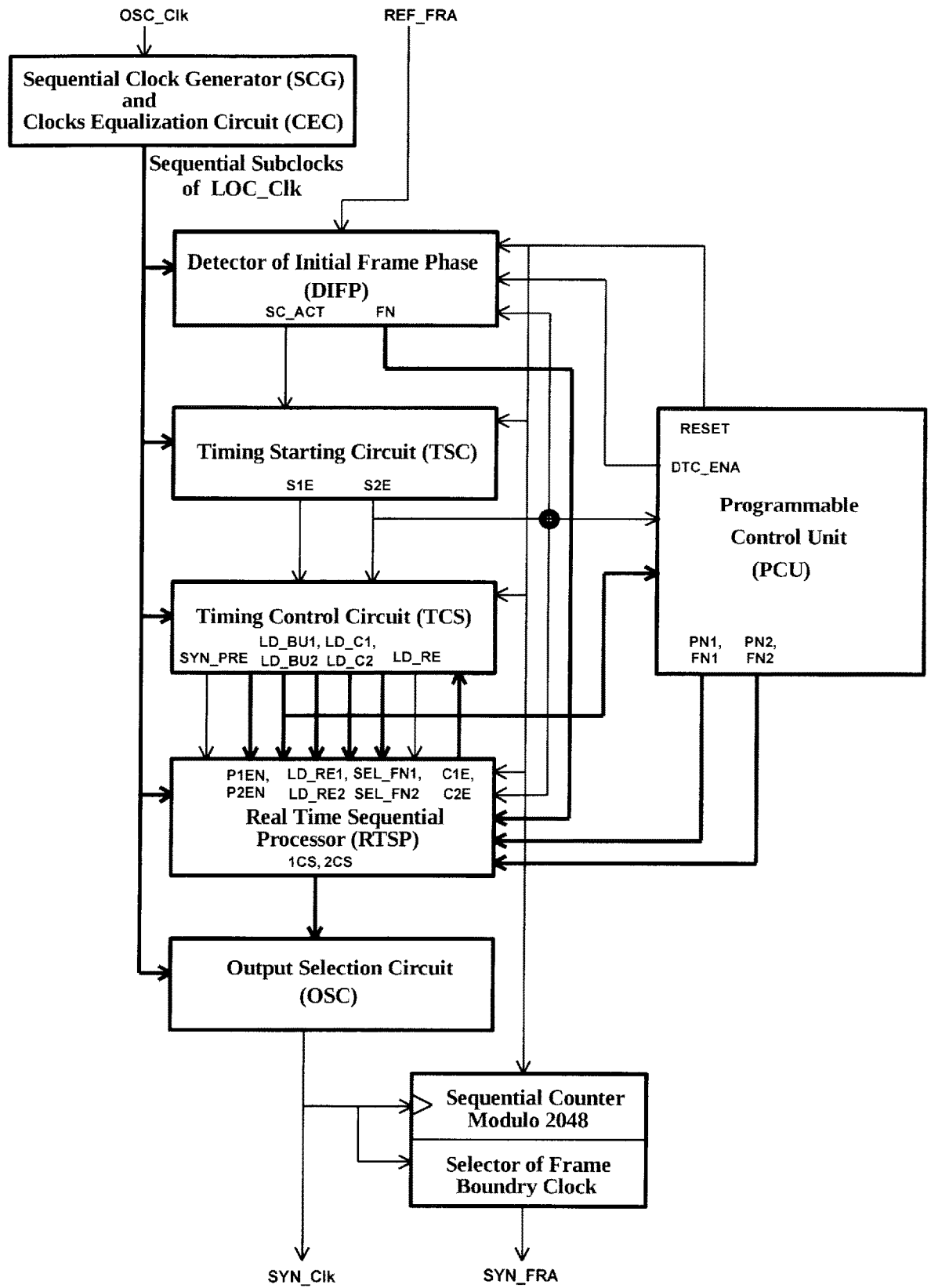
FIG.4 Block Diagram of Digital to Time Converter

FIG.4A Sequential Clocks Generator (SCG) and Output Selection Circuit (OSC)
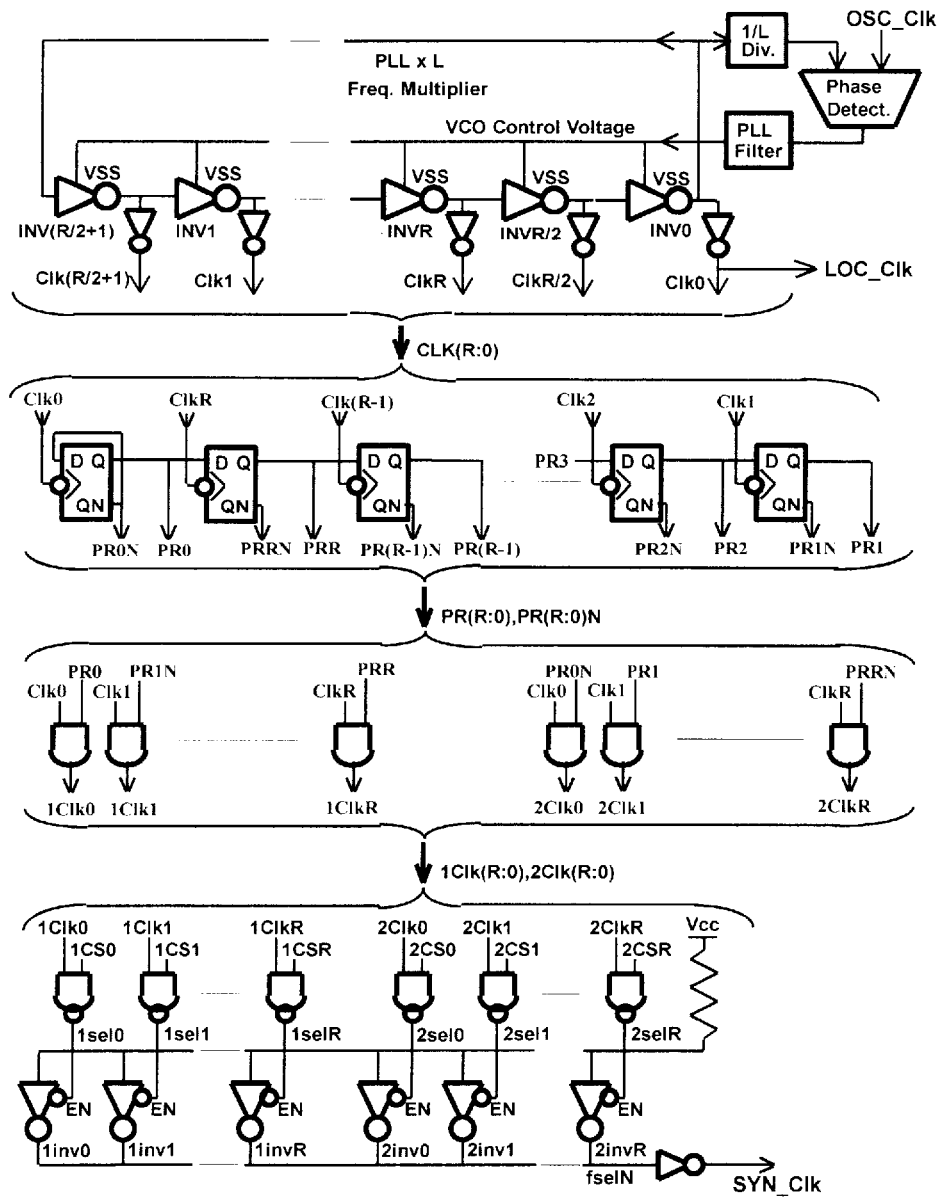
FIG.4B Clocks Equalization Circuit (CEC)
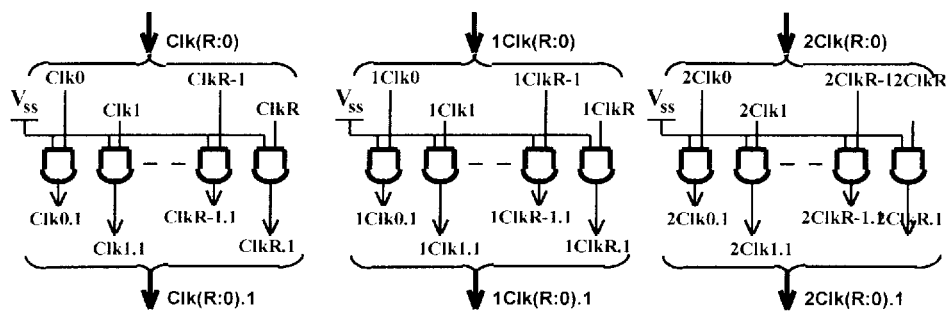

FIG.5A Detector of Initial Frame Phase (DIFP)
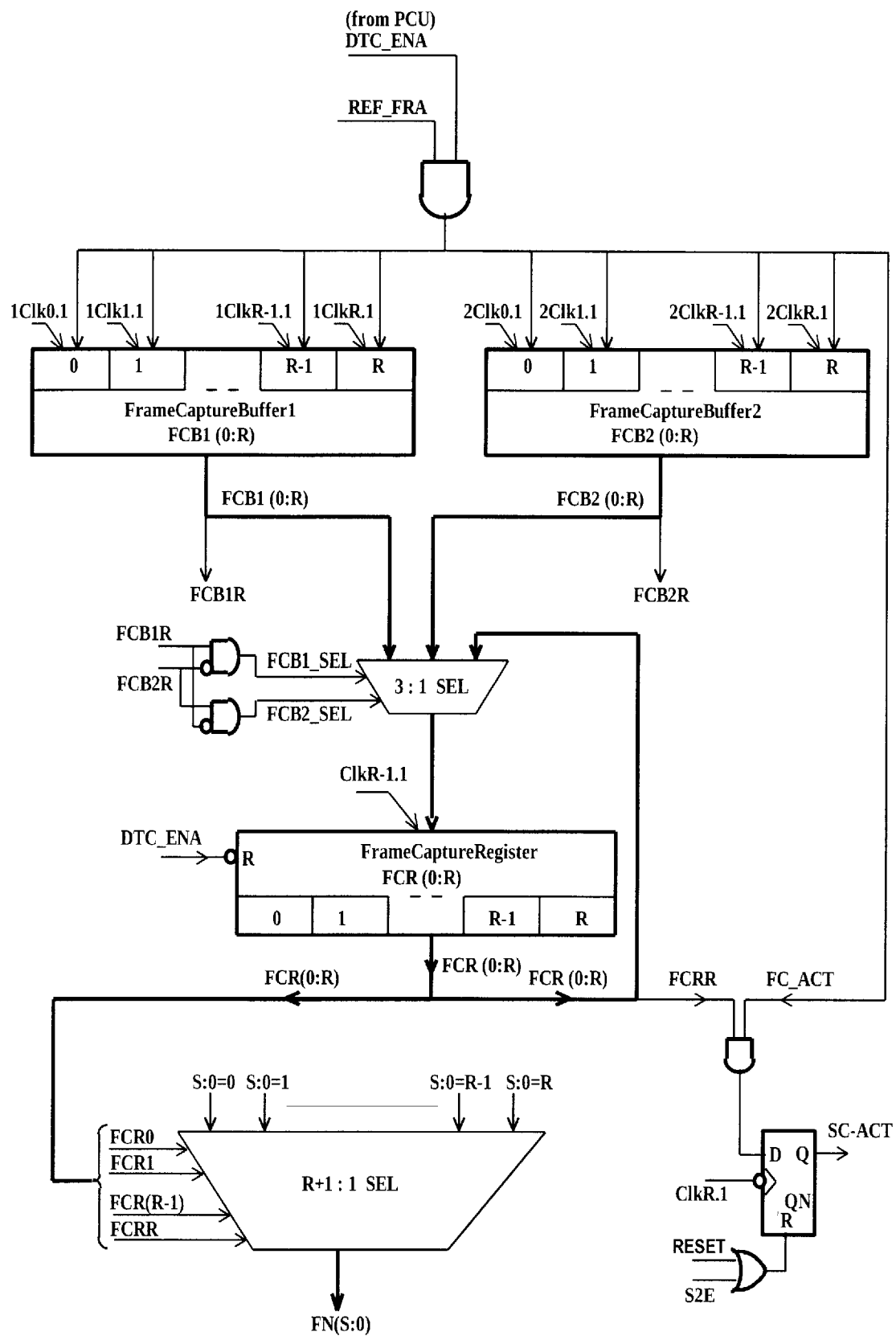

FIG.5B Timing Starting Circuit (TSC)
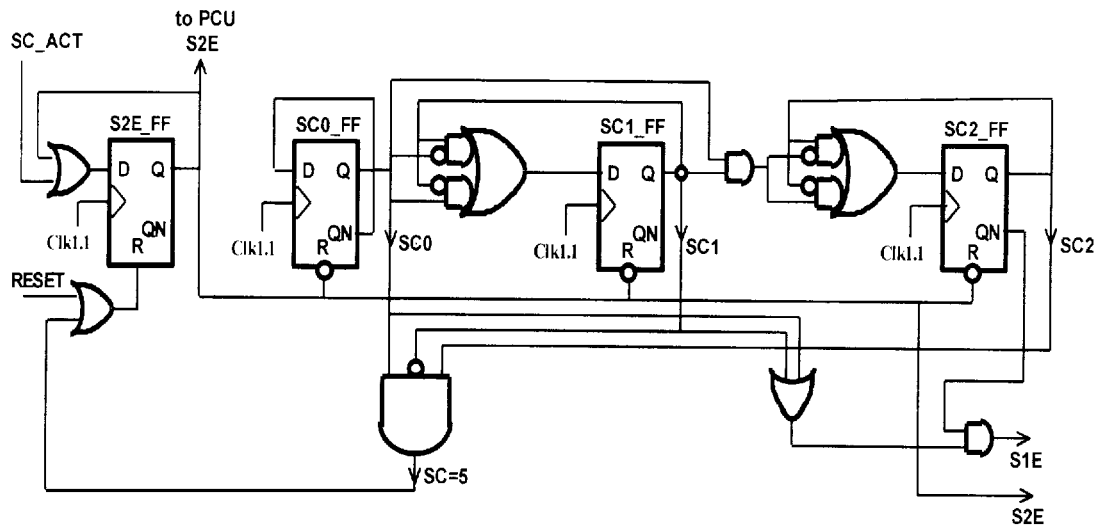
FIG.5C Timing Control Circuit (TCC)
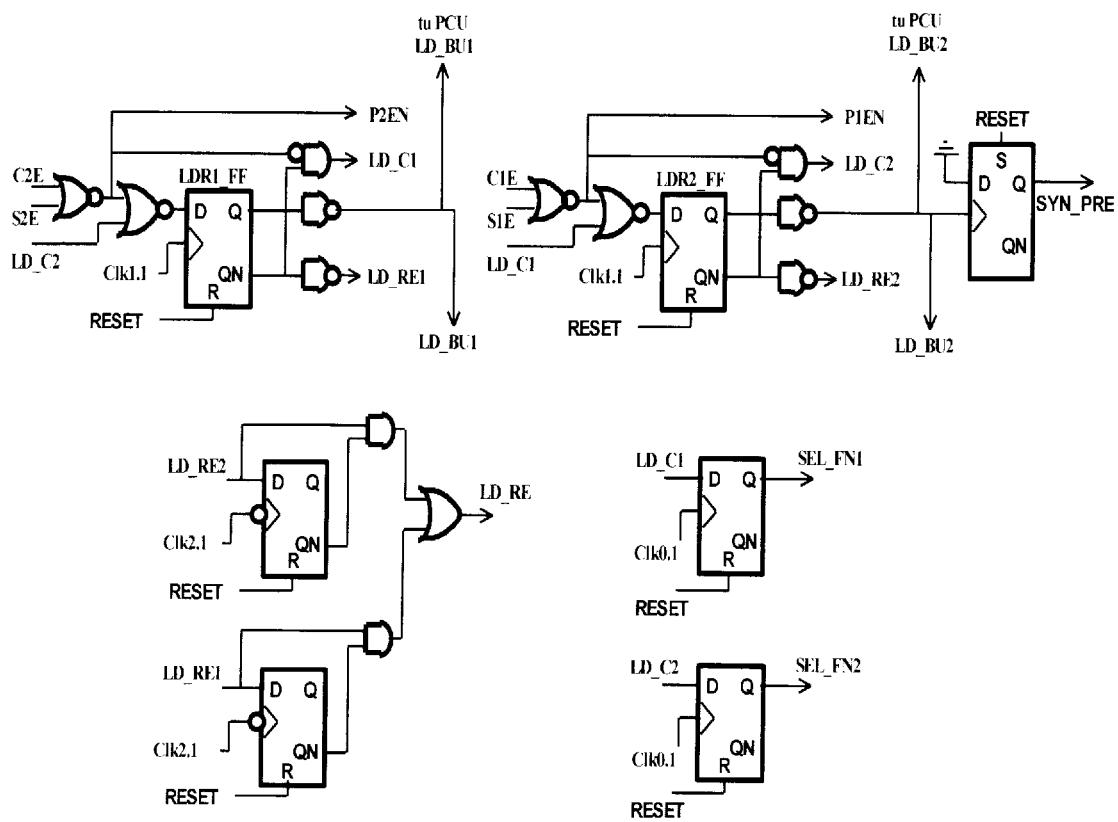

FIG.6 Real Time Sequential Processor (RTSP)
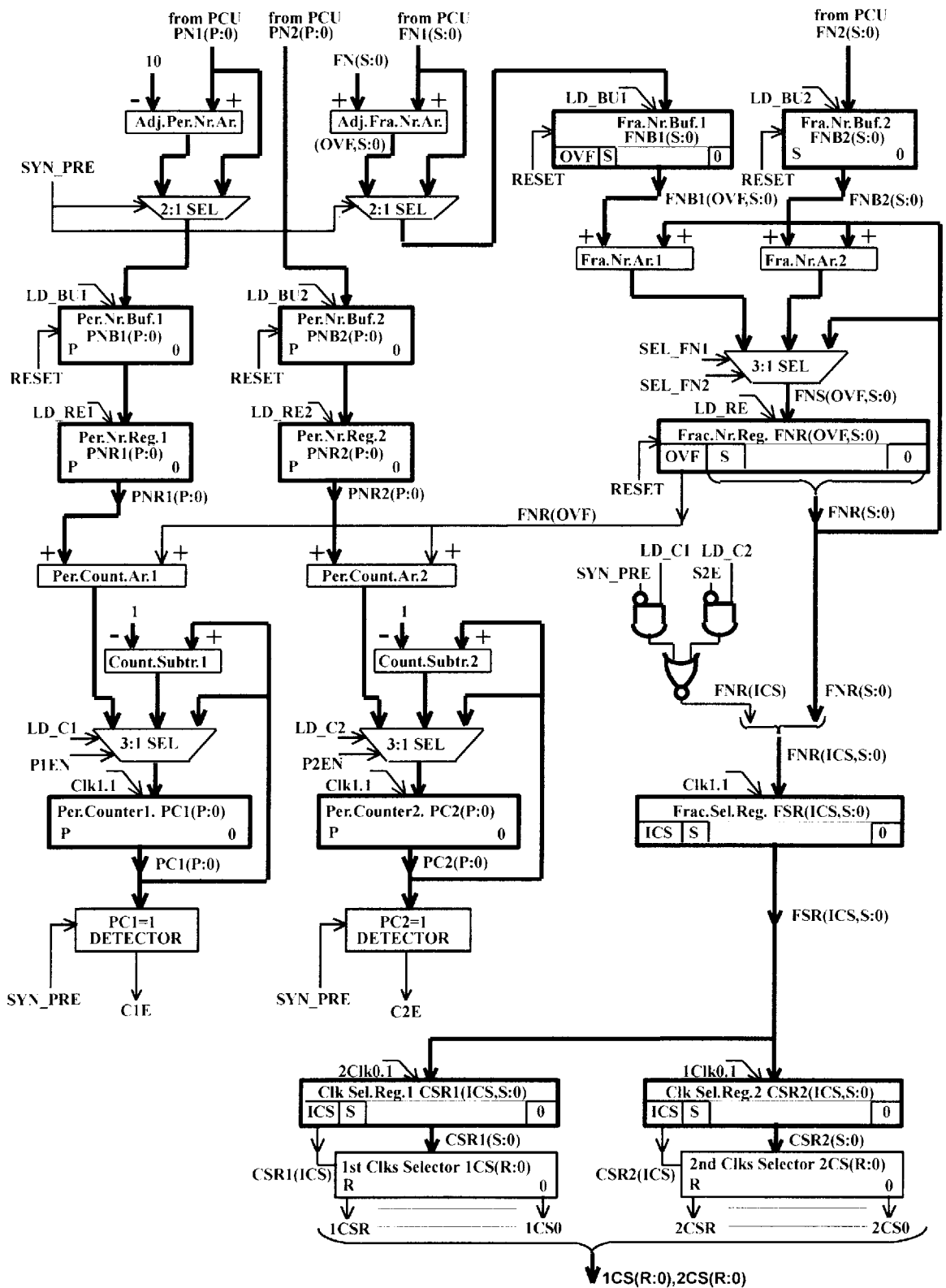

FIG.7A Timing Diagram of Sequential Clocks Generator
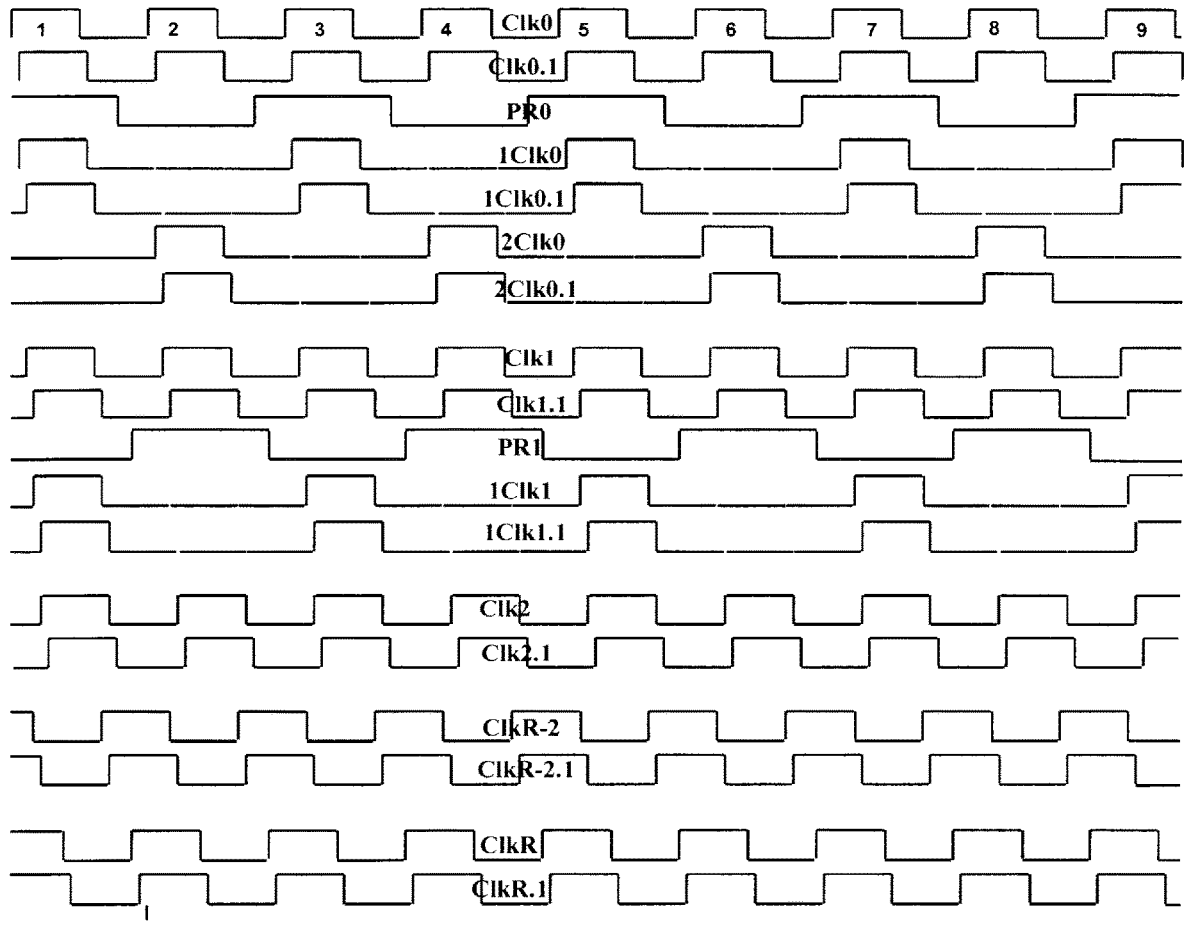

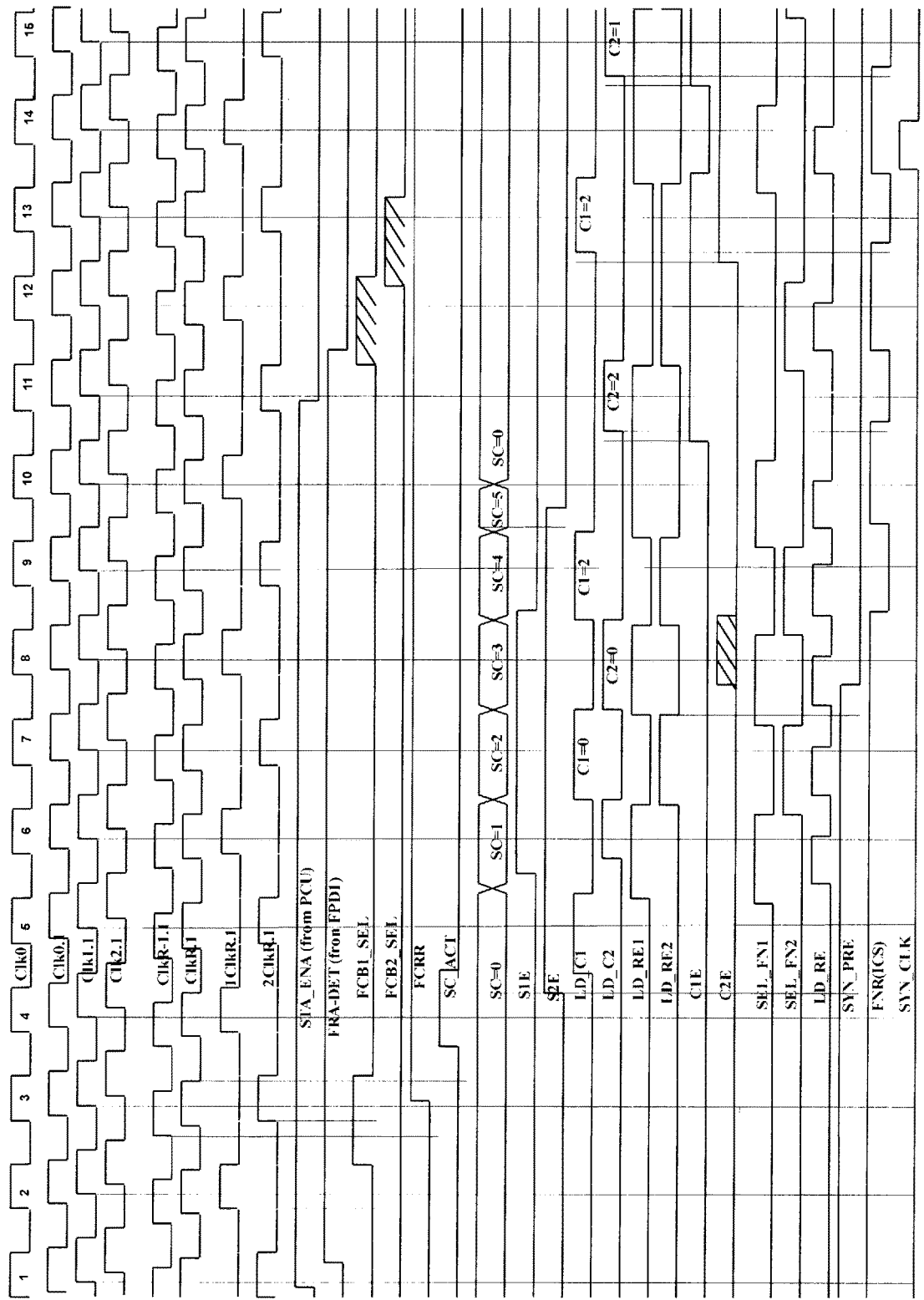
FIG. 7B Timing Diagram of DTC Operations

TIME PROCESSING TECHNOLOGY

BACKGROUND OF THE INVENTION

1. Field of the Invention

This disclosure of the Time Processing Technology (TPT) is contributing methods, systems and circuits for filtering out a phase noise of a timing referencing signal and producing a timing implementing signal from a free running local clock or its subclocks, wherein the filtering out the phase noise is implemented with an open loop system (OLS) or a closed loop system (CLS) of phase control.

The TPT comprises and is enabled by contributed herein a time to digital converter (TDC), a rational number filter (RNF) and a digital to time converter (DTC), securing improved resolution and open loop operations of phase control systems.

The implementation of OLS comprises:

measuring intervals of the timing referencing signal by using TDC;

low pass phase filtering by passing the measured intervals through RNF;

wherein RNF is using rational numbers with a limited number of denominators only for defining the intervals of the timing implementing signal without any accumulation of digital quantization errors over any plurality of the defined intervals, wherein applications of parts of RNF input signals or output signals are delayed properly, in order to secure the defining the intervals with integer numbers only;

applying the defined intervals to DTC which uses them and the free running local clock or its subclocks for producing the timing implementing signal.

The implementation of CLS comprises:

measuring intervals of the timing referencing signal by using a first TDC and using them as reference inputs of CLS;

measuring intervals of the timing implementing signal by using a second TDC and using them as return inputs of CLS;

low pass phase filtering by passing differences between the reference and return inputs through a CLS filter designed to secure the low pass phase filtering by CLS;

applying outputs of the CLS filter to DTC which uses them and the free running local clock for producing the timing implementing signal.

Furthermore this disclosure contributes a more specific implementation of such TPT by describing a method, system and apparatus for Reducing Phase Noise of Phase Tracking System (RPN PTS) specifying network synchronization solutions offering major stability improvement and substantially lower cost than conventional solutions.

The RPN PTS is designed to secure tracking phase of a referencing signal frame with a noise reducing synchronous clock and synchronous frame consisting of a nominal number of periods of the synchronous clock, wherein the synchronous clock and the synchronous frame are produced by the DTC from a free running local clock or its subclocks in an open loop system (see FIG. 1B) enabling better stability than conventional closed loop systems for phase control.

Such synchronous clock and frame can be synchronized to a referencing frame, a data carrying signal or a Precision Time Protocol (PTP) signals originated in an external source and received from a wireless or wired communication link and can be utilized for synchronizing a local data transmitter, data receiver or a time transfer circuit implementing the PTP.

The RPN PTS solutions can be particularly useful in OFDM systems such as LTE/WiMAX/WiFI/Powerline/ADSL/VDSL, optical communication and PTP systems, since they can secure better stability and phase noise immunity than those facilitated by conventional solutions in constantly expanding and evolving communication systems having hard to predict timing characteristics and phase noise levels.

2. Background Art

2.1 Background Art of the RPN PTS

Open loop phase control systems disclosed in U.S. Pat. Nos. 9,794,096, 9,838,236, 9,769,003 and U.S. Ser. No. 15/707,889 (by Bogdan), presented generic synchronization solutions directed to securing a frequency alignment followed by producing a phase aligned clock.

The RPN PTS disclosure presented herein contributes:

other generic synchronization solutions enabling a more direct synthesis of the phase aligned clock combined with a more efficient phase noise reduction of the synthesized clock tracking phase of the referencing signal frame.

species type solutions directed to preventing uncontrolled phase transients and improving quality of the synchronous clock synthesized with the OLS or CLS based configuration filtering out phase noise of the referencing signal.

2.2 Background Art of TDC

A high resolution phase frequency detector (HRPFD) using subclocks of local clock for improving resolution of digital measurements of a signal phase was disclosed in U.S. Pat. No. 6,864,672 (by Bogdan).

A frame phase detector (FPD) specifying a method for combining an indefinite number of the HRPD measurements without an accumulation of digitization errors, was disclosed in U.S. Pat. No. 8,374,075 (by Bogdan).

The TDC disclosed herein contributes:

splitting subclocks of the local clock to odd/even subsets of subclocks belonging to odd/even cycles of the local clock and using the odd/even subsets for detecting phase components of higher resolution, in order to prevent overwriting of a phase capture register by a next such subset of subclocks before the phase capture register is downloaded to a buffer;

using a sequential counter modulo $2^K$ (instead of two separate counters of the local clock used in HPRD and the FPD method), for the combining phase measurements without the accumulation of digitization errors.

2.3 Background Art of DTC

A phase synthesizer (PS) specifying the splitting of the subclocks of the local clock and using the resulting subsets of subclocks for synthesizing phase programmed by PCU, was disclosed in U.S. Pat. Nos. 8,374,075, 10,057,047 and PCT/CA2006/001120 (by Bogdan).

TDC contributions over the PS, are including:

a detector of initial frame phase (DIFP) used for measuring phase of an external event (such as a first detection of a referencing signal edge) providing a base time for real time operations of DTC;

a timing starting circuit generating signals defining timing of an initialization of sequential stages of a real time sequential processor (RTSP);

methods and circuits for correcting initial phase amendments programmed by PCU by subtracting from them an RTSP initialization delay, preloading such sequential stages of RTSP with the corrected phase amendments and applying the preloaded amendments to the local clock in order to produce the synthesized clock initiated by the real time event and programmed by PCU.

SUMMARY OF THE INVENTION

1A. Principles of Operation

This disclosure contributes non-conventional solutions preventing uncontrolled phase transient of the synthesized clock caused by accumulations of quantization errors occurring during such phase measurements, filtering and synthesis.

Such contribution includes using rational numbers instead of floating point arithmetic, in order to prevent accumulations of quantization errors occurring when conventional FIR or IIR filters are used.

The accumulation of quantization errors of the phase measurements, is prevented by adding 1 to every phase of the referencing signal measured by counting periods of the local clock or subclocks occurring during every period of the referencing signal frame;

In order to prevent the accumulation of quantization errors related to the phase filtering, rational numbers are used for deriving, expressing and utilizing the filtered phases during preparing the synthesis of the synchronous clock.

The accumulation of the quantization errors of the phase filtering with a FIR filter using such rational numbers (further named as RNF FIR) can be prevented by using an integer part only of a filtered phase for producing the phase amendment, while a fractional part of the filtered phase is used to supplement a fractional part of a next the filtered phase before an integer part of such supplemented next filtered phase is used for producing a next the phase amendment; wherein such accumulation prevention may be also defined as comprising the steps of:

using the measured phase for deriving the filtered phase expressed with a rational number;

supplementing the filtered phase by adding to it a fractional part of a previous supplemented filtered phase expressed with a rational number;

using an integer part only of the supplemented filtered phase for producing the phase amendment applied to the local clock in order to produce the synchronous clock.

This disclosure contributes a method, system and circuit for an open loop system (OLS) reducing phase noise introduced by a timing referencing frame to a synchronous clock tracking phase of the timing referencing frame, by using TDC for measuring phases of the referencing frame, a low pass FIR filter for filtering out phase noise of the timing referencing frame, a control circuit producing phase amendments of the synchronous clock based on filtered phases of the timing referencing frame and a nominal number of periods of the synchronous clock contained in a synchronous frame corresponding to the timing referencing frame, and DTC using the phase amendments for producing the synchronous clock from a free running clock or its sub-clocks, wherein the filtered phases and the phase amendments are expressed with rational numbers; wherein an implementation of such OLS is comprising:

presetting DTC by using an initializing edge of the timing referencing frame, in order to secure initial phase alignment of OLS needed to start the producing the synchronous clock;

measuring, using TDC, phases of the timing referencing frame by counting positive edges of the free running clock or its sub-clocks occurring between edges of the timing referencing frame and adding 1 to a number of the counted positive edges;

filtering, using the low pass FIR filter, the measured phases in order to produce the filtered phases expressed with rational numbers;

supplementing a present one of the filtered phases by adding a fractional part of a previous one the supplemented filtered phase to the present filtered phase;

producing the phase amendment of the synchronous clock by using an integer part of the supplemented filtered phase and the nominal number of the synchronous clock periods;

applying, using DTC, the phase amendment to the synchronous clock by using the free running clock or its sub-clocks, in order to produce the synchronous clock and the synchronous frame containing the nominal number of such amended synchronous clocks.

The accumulation of the quantization errors of the phase filtering with an IIR filter may be prevented by using an integer part only of a filtered phase for producing the phase amendment and supplying recursive branches of the filter while a remaining still fractional part of the filtered phase is compensated by supplementing a next measured phase with a retained measured phase corresponding to the remaining fractional part of the filtered phase, wherein an integer part only of the supplemented next measured phase is used for producing a next said filtered phase while a remaining fractional part of the supplemented next measured phase is added to a following it the supplemented measured phase;

wherein such accumulation prevention can be defined as comprising:

deriving a rational number expressing the retained measured phase needed for compensation of the fractional part of a previous said filtered phase not contributing yet to the produced phase amendment, wherein the retained measured phase is derived by applying an inverse transformation of a filter transfer function to the fractional part of the previous filtered phase;

deriving the supplemented measured phase by adding the measured phase, the retained measured phase and a fractional part of a previous such supplemented measured phase;

using the integer part only of the supplemented measured phase for producing the filtered phase expressed as a rational number;

using the integer part only of the produced filtered phase for producing the phase amendment applied to the local clock or the subclocks of the local clock in order to produce the synchronous clock;

It shall be noted that above mentioned derivations of the supplemented filtered phases or supplemented measured phases can be defined as utilizing an accumulation, limited by a single quantization step, of fractional parts of the filtered phases or the retained measured phases, wherein integer overflows of such accumulation are not participating in a further accumulation process but are added to the filtered phases or to the measured phases in order to produce the supplemented filtered phases or the supplemented measured phases.

When an RNF FIR filter is used for the phase filtering both mentioned above accumulation prevention methods can be used, but the earlier method is simpler and thus more useful in such case.

When an RNF IIR filter is utilized for the phase filtering, only the more complex later method can be used.

Furthermore utilization of such RNF FIR filters can secure better stability than that facilitated by using such RNF IIR filters.

The above principles of operation and their implementations with the configurations shown in FIG. 1A, FIG. 1B and FIG. 1C are covering a wide variety of synchronization systems some of which are exemplified below.

1B. Configurations Implementing the TPT and RPN PTS

The TPT shown in FIG. 1A is utilizing the programmable control unit (PCU) for implementing the programmed time transfer function designed to secure a specific relation between the timing referencing signal and timing implementing signal needed for a specific application, wherein such securing of the specific relation includes filtering out distortions introduced to the timing reference signal by its transmitter, transmission channel and receiver; wherein:

a free running local oscillator clock or its subclocks are fed to the time to digital converter (TDC) and used by it and PCU for the measuring the timing referencing intervals signaled by the timing referencing signal (named as REF_FRA in later parts of the specification);

the measured time intervals x(n) are supplied to the rational number filter (RNF) which is defining the intervals of the timing implementing signal y(n), wherein such defining of the intervals includes filtering out the distortions of the timing referencing signal;

the defined intervals are read by the digital to time converter (DTC) and used by it for producing the timing implementing signal (SYN_Clk) from the free running local clock or its subclocks.

Such TPT operations are coordinated by the control circuit (CC) synchronized by the local clock (LOC_Clk); wherein the CC:

sends the signals TDC_ENA and DTC_ENA enabling initialization of TDC and DTC operations; responds to TDC's RD_REQ by downloading the measured referencing interval x(n) into an input register of RNF;

responds DTC's LD_BUF by loading the timing implementing interval y(n) to an output register of RNF which is read by DTC.

The RPN PTS (shown in FIG. 1B) is implementing such TPT for synthsizing the clock (SYN_Clk) synchronous to the referencing frame (REF_FRA), by defining phases of the synthesized clock with the RNF and implementing them with the DTC; wherein:

TDC is capturing phases of REF_FRA with the sequential clocks generated by the sequential clocks generator (SCG) detailed FIG. 4A);

the captured phases of REF_FRA supplied as Phase Reg. are read by PCU prompted by RD_REQ in order to calculate lengths of REF_FRA periods;

the calculated lengths are processed by RNF implemented by PCU in order to derive phase adjustments PN, FN of SYN_Clk;

the derived phase adjustments are read by DTC and applied to SYN Clk in order synchronize SYN_Clk and SYN_FRA (containing a known number of SYN_Clks) to REF_FRA.

Such RPN PTS shall secure:

reduction of the phase noise of the referencing signal transferred to the synthesized clock, based on utilizing such RNF for implementing phase filtering methods eliminating an accumulation of quantization errors and caused by them uncontrolled phase transients;

major cost reduction enabled by utilizing an ubiquitous free running clock of virtually any frequency instead of a much more expensive voltage controlled VCXO with a specific frequency range required in conventional synchronization solutions;

stability improvements important in constantly evolving and expanding communication networks with hard to predict characteristics and requirements.

The Phase Transferring Configuration (PTC) shown in FIG. 1C is designed to enable better performance monitoring & control, by adding to the configuration shown in FIG. 1B the second TDC (TDC2) and control signals coordinating operations of such expansion (DTC_ENA2, RD_REQ2, RESET).

The FIG. 1C presenting such PTC with performance monitoring & control, shows also the synthesized frame (SYN_FRA) connected to the input of the TDC2.

Such SYN_FRA shall be generated by DTC by selecting every Nth impulse of SYN_Clk only, wherein N is the nominal number of SYN-Clks expected to occur within every SYN-FRA corresponding to REF_FRA (see also FIG. 4 showing DTC structure assuming that N=2048).

TDC1/TDC2 are capturing phases of REF_FRA/SYN_FRA accordingly with the sequential clocks generated by the sequential clocks generator (SCG).

The captured phases of REF_FRA/SYN_FRA are read by PCU prompted by RD_REQ1/RD_REQ2 in order to calculate lengths of REF_FRA/SYN_FRA periods accordingly However the purpose of such TDC2 addition is to enable measuring a difference between phases of the configuration input (REF_FRA) and output (SYN_FRA) by subtracting a phase captured by TDC2 from that captured by TDC1.

Such measuring of the difference is enabled by securing a common base time for the captured phases of REF_FRA and SYN_FRA, by resetting counters, used in TDC1 and TDC2 for providing such common base time, with the same RESET signal generated by PCU before the phase tracking begins (see also FIG. 3A showing TDCs structure).

This disclosure contributes using such measured differences for monitoring the open loop phase tracking operations in order to detect a hardware malfunctioning.

Such monitoring may comprise using PCU equipped with an additional RNF implementing a differential transform $H_{dif}(z)=1-H(z)$, while the basic RNF implements the transform $H(z)$ of $x(n)$; wherein such expanded configuration may be used for:

estimating differences between consecutive phases of REF_FRAs and corresponding SYN_FRAs by applying inputs $x(n)$ to the additional RNF implementing the differential transform $H_{dif}(z)$;

adding a present one to all past such estimated differences in order to derive an expected difference $y_{dif}(n)$ between the present phases of the REF_FRA and SYN_FRA;

calculating a sum of maximum errors caused by quantization errors contributed by the DTC and TDC2 and any possible misalignment between the basic RNF implementing the transform $H(z)$ and the additional RNF implementing the $H_{dif}(z)$ transform of $x(n)$;

defining an acceptable phase error by multiplying such sum of the maximum errors by a tolerance factor >1 (such as 2 for example);

checking if a difference between the measured difference and the expected difference is narrower than the defined acceptable phase error.

If the difference between the measured difference and the expected difference is not narrower, a corrective action such as correcting the SYN_Clk and SYN_FRA or restarting the phase tracking process may be implemented.

The open loop synthesis of the synchronous clock illustrated above as using the configurations shown in FIG. 1A, FIG. 1B and FIG. 1C; includes:

digital measurements of a phase of the referencing signal by counting edges of the local clock or subclocks occurring during every period of a frame of the referencing signal;

using RNF for filtering out phase noise from the measured phases;

using resulting filtered phases and the nominal number of periods of the synthesized clock corresponding to the referencing signal frame, for producing phase amendments applied to the local clock (LOC_Clk) in order to produce the synthesized clock (SYN_Clk).

The term the referencing signal frame covers very wide variety of frames including such as those created by consecutive OFDM symbols or specified by OFDM, SONET/SDH or Synchronous Ethernet standards or defined by PTP time stamps.

Every one of such referencing signal frames is expected to contain a nominal number of periods of a transmitter/master clock having a known relation or equal to the nominal number of the periods of the synchronous clock synthesized locally.

Such synchronous clock may be used as a sampling clock recovering data from the referencing signal or a PTP clock.

The RPN PTS solutions are comprising utilization of very inexpensive means for reducing low frequency phase noise and alleviating consequences of a frequency drift of the local oscillator clock which are most expensive to achieve using conventional synchronization solutions.

In cases when reducing high frequency phase noise is critical as well, such RPN PTS solutions may include also utilization of high bandwidth phase locked loops for an inexpensive reduction of phase jitter of the local clock and/or the synchronous clock synthesized from the local oscillator clock.

This disclosure contributes also another solution securing said utilization of ubiquitous cost lowering oscillator, by using the closed loop method instead of the open loop methods mentioned above.

Such closed loop method can be implemented with the PTC shown in FIG. 1C as well, by utilizing PCU programmed to implement the closed loop system (CLS) instead of the open loop system (OLS) for applying a required transfer function to a phase of REF_FRA.

Wherein an input signal to the CLS filter is derived by subtracting a SYN_FRA phase captured by TDC2 from a REF_FRA phase captured by TDC1, wherein the SYN_FRA phase/REF_FRA phase is supplied to PCU as Phase Reg.2/Phase Reg.1 accordingly.

2. Time to Digital Converter (TDC)

This disclosure contributes TDC (shown FIG. 3A and FIG. 3B) designed to detect phases signaled by edges of the referencing signal REF_FRA.

The detected phases are outputted as comprising:

integer components (shown as IPR(K:0)) specifying numbers of cycles of the local clock (LOC_Clk represented by it's equivalent CLK0.1) counted with the synchronous counter modulo $2^K$ (SC);

fractional components (shown as FPR(S:0)) specifying numbers of subclocks of the local clock counted from the beginnings of current cycles of the local clock.

TDC comprises:

the synchronous counter modulo $2^K$ (SC) counting cycles of the local clock (represented by the equivalent subclock Clk0.1) in order to comprise a modulo $2^K$ number of cycles of the local clock expired after SC initialization by an external signal (such as TDC_RES for example);

wherein such number of the expired local clock cycles is used as contributing such integer phase component;

the sequential clocks generator (SCG) producing plurality of subclocks of the local clock (LOC_Clk) and splitting the subclocks into odd/even subsets of the subclocks belonging to odd/even cycles of the local clock;

wherein using such odd/even subset for capturing phase of such referencing signal edge is securing a time margin (needed to download the captured phase before it is overwritten during a next the odd/even subset), as that defined by the following even/odd subset accordingly (i.e. as equal to one cycle of the local clock);

detector of a fractional phase (DFP) of the referencing signal using the odd/even subsets for capturing such fractional phase component and using following them subsets of subclocks (belonging to following cycles of the local clock) for a timely loading of the captured fractional phase component and a latest counted such integer phase component into TDC output registers (by using RD_REQ and LD_SC accordingly);

wherein such using the odd/even subsets for the capturing the fractional phase and such using the following them subsets of subclocks for the timely loading of the captured fractional phase and the latest counted integer phase, prevents any dead zone occurrence by securing sufficient time margins between the capturing the fractional phase and the latest counting the integer phase and the downloading them to the TDC output registers.

The odd/even subsets of subclocks are also named as phase1/phase 2 subclocks and marked with digit 1/2 accordingly placed in front of specific subclocks names.

PCU initiates a time measurements base with the TDC reset (TDC_RES) signal applied to SC.

SC sends to PCU the end of cycle (EOC) signal whenever it's content reaches $2^K-1$.

Such EOC signals combined with such outputted (captured and counted) phases are allowing PCU to measure the time delays of the REF_FRA edges related to the time measurements base or other the REF_FRA edges even if the measured time delays are longer than SC cycle (amounting to $2^K$ cycles of the local clock).

Instead of being initiated by the PCU's TDC_RES, the time measurements base of TDC may be also initiated more accurately by other closer to real time phenomenon such as an appearance of a first edge of REF_FRA detected by DFP.

Such more accurate initialization of TDC by the first edge of REF_FRA detected by DFP may be implemented similarly as the initialization of DTC (shown in FIG. 4) by a first edge of REF_FRA detected by DFIP (shown in FIG. 5A).

The more accurate initialization shall secure more accurate measurements of time delays based on phase detections made by TDC later on.

Such greater accuracy of the time delays measurements can be useful in other applications of the universal TDC solution contributed herein.

3. Digital to Time Converter (DTC)

The DTC implements a digital wave synthesis from multi-subclocks (DWS MSC) for defining timing of the synthesized clock.

The DWS MSC comprises utilizing programmable phase modifications which are defined below.

Phase increases of the synthesized clock are provided by adding and/or subtracting whole clock periods and/or fractional subclock delays obtained from serially connected delay elements which the local clock is propagated through, to a present phase obtained from a counter of local clock periods and/or a present fractional subclock delay.

The DWS MSC provides ~10 times better phase adjustment resolution than conventional methods; because the DWS MSC can modify phase with time intervals specified in fractions of local clock cycle, instead of inserting or eliminating whole local clock cycles from a synthesized clock.

The DWS MSC provides an implementation of programmable algorithms for synthesizing a very wide range of low and high frequency wave-forms.

The DWS MSC comprises: a 1-P phase generator, a synchronous sequential processing (SSP) method and apparatus for real time processing and selection of a phase of out-coming wave-form, and a programmable computing unit (PCU) for controlling SSP operations and supporting signal synthesis algorithms.

The 1-P phase generator is explained further below as extending an 1 bit counter of an odd/even phase generator to a p bit counter enabling $2^P=P$ phases of the subclocks of the local clock to be generated.

Such 1-P phase generator is exemplified below as buffering a number of bits propagated within the phase generator which is equal to the P number of generated phases.

Such buffering is combined with the elimination of p bit counters and their decoders needed for selecting phases for the subclocks following the referencing clock, as it is explained further below.

The odd/even phase generator provides splitting of reference subclocks, generated by outputs of a reference propagation circuit built with serially connected gates which a local clock is propagated through, into odd phase subclocks which occur during odd cycles of the local clock and even phase subclocks which occur during even cycles of the local clock, wherein the odd/even phase generator comprises:

said reference propagation circuit connected to the local clock;

serially connected flip-flops wherein a clock input of a first flip-flop is connected to the local clock and a data input of the first flip-flop is connected to an inverted output of the first flip-flop while a data input of any of following flip-flops is connected to an output of an earlier flip-flop and a clock input of any of the following flip-flops is connected to a subclock of the local clock following a subclock connected to a clock input of the earlier flip-flop;

an odd/even selector using such serially connected flip-flops for generating sets of the odd/even subclocks activated during odd/even cycles of the local clock cycle accordingly, wherein the output of the $1^{st}$ flip-flop is used to select odd or even local clocks while the output of any following Nth flip-flop is used to select the odd or even reference subclocks from the Nth output of the reference propagation circuit.

It is defined below how the odd/even generator of 2 phases of the subclocks can be expanded into a generator of P phases of the subclocks, by comprising:

an 1-P counter & buffer built as an extension of the $1^{st}$ single bit flip-flop of the 2 phases generator wherein the entire 1-P counter & buffer is clocked by the local clock used as a first subclock, wherein an output of the 1-P counter & buffer is used later to select a 1-P phase number for the $1^{st}$ subclock;

2-N parallel multi-bit buffers built as extensions of the 2-N single bit flip-flops of the 2 phases generator wherein an output of the 1-P counter & buffer is clocked by the $2^{nd}$ subclock into the $1^{st}$ such multi-bit buffer which is clocked by the $3^{rd}$ subclock into the $2^{nd}$ multi-bit buffer and the content of the 1-P counter & buffer is similarly propagated into all the next multi-bit buffers until the Nth subclock loads the N−2 multi-bit buffer into the N−1 multi-bit buffer, wherein the $1^{st}$ multi-bit buffer defines a phase number for the $2^{nd}$ subclock and next such multi-bit buffers define similarly phase numbers for their corresponding subclocks until the N−1 multi-bit buffer defines a phase number for the Nth subclock;

1-P phase selectors, built as extensions of the 2 phases odd/even selectors, wherein a first of the 1-P selectors is connected to a first bit of the 1-P counter & buffer and to first bits of the following it N−1 multi-bit buffers in order to select a $1^{st}$ phase for the $1^{st}$ subclock and following it N−1 subclocks, while every following K phase selector (2<K<P) is connected to the K bit of the 1-P counter & buffer and to the K bits of the following it N−1 multi-bit buffers in order to select the K phase for the first subclock and following it N−1 subclocks.

Such 1-P phase generator can use both solutions defined below:

using rising edges of the subclocks for clocking the 1-P counter & buffer and the multi-bit buffers while negative pulses of the subclocks are used for activating outputs of the 1-P selectors generating the 1-P phases of the subclocks;

or using falling edges of the subclocks for clocking the 1-P counter & buffer and the multi-bit buffers while positive pulses of the reference subclocks are used for activating outputs of the 1-P selectors generating the 1-P phases of the subclocks.

The 1-P phase generator may use an 1-P circular shifting register (SR) instead of the 1-P counter & buffer fer defining phase in which the $1^{st}$ subclock is enabled.

Consecutive 1-P bits of the SR may be used to select consecutive 1-P phases in which the $1^{st}$ subclock is enabled.

An initialization procedure shall preset to 1 only one of the 1-P bits of SR, in order to start the process of phases generation at the phase selected by the preset bit of the SR.

Similarly as the 1-P counter & buffer the SR shall be clocked by the local clock used as a first subclock and SR content shall be propagated through the 2-N multi-bit buffers with the 2-N subclocks.

The 1-P phase generator solutions may include supplementing the remaining 2-N multi-bit buffers with their own subclock counters, instead of relying on the defined above propagation of the content of the 1-P counter & buffer into the remaining 2-N multi-bit buffers.

The use of such additional counters requires adding preset means for all the counters used, in order to maintain the same or predictably shifted content in all the 1-N counters used in parallel.

Continues maintaining of said predictability of all the parallel counters content is necessary for generating predictable multi-phase sequences of the subclocks.

Said SSP implements selection of one of multi subclocks for providing an edge of out-coming synthesized signal, wherein said subclocks are generated by the outputs of serially connected gates which the local clock is propagated through.

SSP operations comprise calculating a binary positioning of a next edge of the out-coming wave-form versus a previous wave edge, which represents a number of local clock cycles combined with a number of local clock fractional delays which correspond to a particular subclock phase delay versus the reference clock.

Furthermore the SSP utilizes selective enabling of a particular subclock for implementing calculated phase step between the previous and the current wave-form edges.

The SSP comprises using multiple serially connected processing stages with every stage being fed by data from the previous stage which are clocked-in by a clock which is synchronous with the local clock.

Since every consecutive stage is driven by a clock which is synchronous to the same local clock, all the stages are driven by clocks which are mutually synchronous but may have some constant phase displacements versus each other.

The synchronous sequential processing (SSP) multiplies processing speed by splitting complex signal processing operation into a sequence of singular micro-cycles, wherein:

every consecutive micro-cycle of the complex operation is performed by a separate logical or arithmetical processing stage during a corresponding consecutive time slot synchronous with the local clock providing a fundamental timing for a synthesized wave-form;

serially connected sequential stages are connected to a programmable control unit (PCU), wherein the sequential stages are clocked by subclocks generated by a circuit built with serially connected gates which the local clock is propagated through;

whereby inputs from the PCU are processed into a phase delay between a next edge of the synthesized wave-form versus a previous edge and a position of the next edge is calculated by adding the phase delay to a position of the previous edge, wherein the positions of wave-form edges are provided by a last of the sequential stages and said positions are expressed with numbers identifying reference subclocks needed for generating said wave-form edges.

Furthermore this disclosure includes such SSP upgraded by including a configuration of parallel multiphase stages extending the time slots allowed for the micro-cycles of the synchronous sequential processor by a factor of P, wherein:

2-P stages are added to the original sequential stage and every one of the resulting 1-P parallel multiphase stages is clocked with a corresponding 1-P phase subclock, wherein such 1-P phase subclock begins during the corresponding to that phase 1-P cycle of the local clock and has a cycle which is P times longer than the local clock cycle;

whereby consecutive 1-P parallel multiphase stages have processing cycles overlapping by 1 cycle of the local clock wherein every 1-P parallel processing stage has P times longer cycle time equal to the cycle time of the corresponding 1-P phase subclock used for timing that stage.

The parallel multiphase stages may be built with 1-P parallel phases, wherein each of such parallel phases comprises multiple sequential stages which are connected serially and are driven by subclocks belonging to the same 1-P phase.

The SSP may use such parallel multiphase stages for synthesizing a target wave-form by assigning consecutive parallel phases for the processing of a synthesized signal phase using signal modulation data provided by a programmable control unit (PCU) or by any other source.

Consequently the SSP comprises using 1 to P parallel phases which are assigned for processing incoming signal data with clocks corresponding to-local clock periods number 1 to P, as it is further described below:

circuits of phase1 process edge skews or phase skews or other incoming signal data with a clock which corresponds to the local clock period number 1;

circuits of phase2 process edge skews or phase skews or other incoming signal data with a clock which corresponds to the local clock period number 2;

finally circuits of phase P process edge skews or phase skews or other incoming signal data with a clock which corresponds to the local clock period number P.

Such parallel multiphase processing allows P times longer processing and/or subclocks selection times for said multiphase stages, compared with a single phase solution.

The above mentioned subclock selecting methods further include:

using falling edges of said subclocks for driving clock selectors which select parallel processing phases during which positive subclocks are enabled to perform said synthesized wave-form timing, or using rising edges of said subclocks for driving selectors which select parallel processing phases during which negative subclocks are enabled to perform said synthesized wave-form timing;

using serially connected clock selectors for enabling consecutive subclocks during said processing phases, in order to assure that the enabled subclocks will occur within a selected processing phase and to enable selection of a subclock specified by a number contained in a fraction selection register of a particular processing phase.

The SSP includes using said serially connected gates:

as being an open ended delay line;

or being connected into a ring oscillator which can be controlled in a PLL configuration;

or being connected into a delay line which can be controlled in a delay locked loop (DLL) configuration.

Every said subclock phase delay versus the local clock phase amounts to a fraction of a local clock period which is defined by a content of a fraction selection register which is assigned for a particular processing phase and is driven by the SSP.

The SSP includes using parallel stages for processing of an incoming signal, wherein multiple such parallel stages are working in parallel as they are driven by the same clock which is applied simultaneously to inputs of output registers of all the parallel stages.

The SSP further comprises:

merging of processing phases which occurs if multiple parallel processing phases are merged into a smaller number of parallel phases or into a single processing phase, when passing from a one processing stage to a next processing stage;

splitting of processing phases which occurs if one processing phase is split into multiple processing phases or multiple processing stages are split into even more processing stages, when passing from a one processing stage to a next processing stage.

The SSP includes using the 1-P phase generator defined above to generate SSP clocks which drive said parallel phases and said sequential stages, and to generate selector switching signals for said merging and splitting of processing phases.

The SSP includes time sharing of said parallel phases: which is based on assigning a task of processing of a next wave-form edge timing to a next available parallel processing phase.

The SSP comprises using a decoding of local clock counters and/or other wave edge decoding and/or SSP driving clocks or subclocks, for performing said time sharing phase assignments and for further control of operations of an already assigned phase.

The SSP comprises passing outputs of a one parallel phase to a next parallel phase, in order to use said passed outputs for processing conducted by a following stage of the next parallel phase.

The outputs passing is performed: by re-timing output register bits of the one phase by clocking them into an output register of the next parallel phase simultaneously with processing results of the next parallel phase.

The SSP further comprises all the possible combinations of the above defined: parallel multiphase processing, parallel stage processing, synchronous sequential processing, merging of processing phases, splitting of processing phases, and outputs passing.

The SSP includes processing stage configurations using selectors, arithmometers, and output registers, which are arranged as it is defined below:
   input selectors select constant values or outputs of previous stages or outputs of parallel stages or an output of the same stage to provide arithmometer inputs, and arithmometer output is clocked-in to an output register by a clock which is synchronous to the local clock;
   multiple arithmometers are fed with constant values or outputs of previous stages or outputs of parallel stages or an output of the same stage, and an output selector selects an arithmometer output to be clocked-in to an output register by a clock synchronous to the local clock;
   the above defined configuration as being supplemented by using an output of an output selector of a parallel processing stage for controlling functions of other output selector.

The SSP comprises:
   using switching signals of said input selectors for producing pulses which clock data into output registers of previous stages;
   using switching signals of said output selectors for producing pulses which clock data into output registers of previous stages;

The SSP also comprises:
   using results obtained in earlier stages for controlling later stages operations, and using results obtained in the later stages for controlling the earlier stages operations.

Proper arrangements of said parallel and sequential combinations and said stages configurations provide real time processing capabilities for very wide ranges of signal frequencies and enable a wide coverage of very diversified application areas.

The DWS MSC comprises two different methods for accommodating a phase skew between the local clock and a required carrier clock frequency of the transmitted signal, and both methods allow elimination of ambiguities and errors in encoding of output signal data patterns. Said two methods are further defined below:
   a source of the local clock provides frequency or phase alignment with the timing of the data which are being encoded and sent out in the synthesized output waveform;
   phase skews between the local clock and the timing of the destined for transmission data are digitally measured and translated into implemented by the SSP phase adjustments of the synthesized signal which provide required carrier frequency of the transmitted output signal;
   both above mentioned methods include measurements of phase or frequency deviations of the destined for transmission data versus the local clock, and using said measurements results to assure required carrier frequency of the synthesized signal.

Furthermore the DWS MSC method comprises phase modulations of the synthesized wave-form by adding or subtracting a number of local clock periods and/or a number of fractional delays to a phase of any edge of the synthesized wave-form.

Said adding or subtracting of a number of local clock periods is further referred to as a periodical adjustment, and said adding or subtracting of fractional delays is further called a fractional adjustment.

The DWS MSC method allows synthesizing of any waveform by modulating a phase of the local clock with periodical and/or fractional adjustments of any size.

The SSP method and apparatus disclosed above provide basis for and can be used in a wide variety of digital to time converters (DTCs) such as that described below wherein the SSP performing the task of real time phase processing is named as a real time sequential processor (RTSP).

This disclosure presents DTC method and apparatus for using detection of an initializing real time event being a part of a physical phenomenon, such as detection of a boundary of a received signal frame, for starting generation of a synthesized clock aligned in time to this physical phenomenon and using next such real time events for maintaining such alignment in time, by defining consecutive phases of the synthesized clock with selections of subclocks of a free running local clock specified by data derived by and read from a programmable control unit PCU; wherein:
   a delay between the initializing real time event or signal frame boundary and the local clock, is measured by capturing this event using the subclocks of the local clock (see FIG. 5A);
   reading the data defining the selections of the subclocks, is aligned in time with the synthesized clock;
   the read data are utilized, using the real time sequential processor (RTSP), for specifying the selections defining phases of the synthesized clock (see FIG. 6),
   wherein the RTSP maintains known delays between the reading the data and implementing the selections defining phases of the synthesized clock (see FIG. 6);
   RTSP subtracts from the read data corresponding to them the measured delay and the known delays between the reading the data and implementing the selections, in order to maintain alignment in time of the synthesized clock defined by the initializing real time event and the data derived by and read from the PCU (see FIG. 6).

Such DTC comprises using the DWS MSC method; as it is described below.

DTC performs programmable modifications of a phase of a synthesized clock by unlimited number of gate delays per a modification step with step resolution matching single gate delay at steps frequencies ranging from 0 to ½ of maximum clock frequency, wherein:
   a delay control circuit is connected to a programmable control unit (PCU) wherein the delay control circuit defines size and frequency of phase delay modifications of the synthesized clock versus a local clock, the delay control circuit also having a terminal connected to reference subclocks generated by a reference propagation circuit or connected to odd/even subclocks generated by an odd/even phase selector;
   the local clock is connected to the reference propagation circuit consisting of serially connected gates wherein outputs of the gates generate the reference subclocks providing variety of phase delays versus the local clock;

the reference subclocks are connected to an odd/even phase selector which splits the reference subclocks by generating separate odd subclocks and even subclocks, wherein the odd subclocks begin during odd cycles of the local clock and the even subclocks begin during even cycles of the local clock;

a clock selection register is loaded by the odd subclocks and by the even subclocks with the outputs of the delay control circuit, wherein the odd subclocks or the even subclocks beginning during an earlier cycle of the local clock download outputs of the delay control circuit which select the even subclocks or the odd subclocks beginning during a later cycle of the local clock for providing the synthesized clock;

an output selector is connected to the output of the clock selection register and to the outputs of the odd/even phase selector, wherein the output selector uses inputs from the clock selection register for selecting output of the odd/even phase selector which is passed through the output selector for providing the synthesized clock.

The above defined DTC can use the odd/even phase generator or the 1-P phase generator, which have been already defined above.

DTC method comprises moving a synthesized clock selection point from a delay line which propagates a local clock (see FIG. 4A); wherein:

said phase increases are provided by moving said selection point of the synthesized clock from the local clock propagation circuit, in a way which adds gate delays to a present delay obtained from the propagation circuit;

said phase decreases are provided by moving said selection point of the synthesized clock from the local clock propagation circuit, in a way which subtracts gate delays from a present delay obtained from the propagation circuit;

While implementation of such DTC method is presented in greater details in FIG. 4A & FIG. 6, its principles of operations are explained below.

The PLL×L Freq. Multiplier produces the series of subclocks Clk0, ClkR-Clk1.

The subclock Clk0 keeps clocking in a reversed output of its own selector PR0.

The subclocks CLkR-Clk1 keep clocking in outputs of the previous selectors PR0, PRR-PR2 into their own selectors PRR-PR1.

Since the selector PR0 is being reversed by every Clk0, every selector in the PR0, PRR-PR1 chain is being reversed as well by a falling edge of its own subclock Clk0, ClkR-Clk1, and every selector in the chain represents reversal of its predecessor which is delayed by a single subclock fractional delay.

Consequently the PR0, PR1N-PRR are selecting subclocks Clk0, Clk1-ClkR for any odd processing phase, and their reversals PR0N, PR1-PRRN are selecting subclocks Clk0, Clk1-ClkR during any even processing phase.

The odd/even processing phase has been named phase1/phase2, and their subclocks are named 1Clk0, 1Clk1-1ClkR/2Clk0,2Clk1-2ClkR accordingly.

Since said phase1/phase2 subclocks can be used in separate designated for phase1/phase2 phase processing stages which can work in parallel, a time available for performing single stage operations can be doubled (see also FIG. 5A and FIG. 6 for more detailed presentation of such multiphase parallel processing).

Furthermore, the Clock Selection Register 1 (CSR1) can be reloaded at the beginning of the phase2 by the 2Clk0 and its decoders shall be ready to select a glitch free phase1 subclock which is defined by any binary content of the CSR1.

Similarly the CSR2 is reloaded by the 1Clk0, in order to select a single glitch free subclock belonging to the phase2.

While DTC comprises using all the listed below local clock propagation circuits:

an open ended delay line built with serially connected logical gates or other delay elements;

a ring oscillator built with serially connected logical gates or other delay elements, which have propagation delays controlled in a PLL configuration;

a delay line built with serially connected logical gates or other delay elements, which have propagation delays controlled in a Delay Locked Loop (DLL) configuration.

It shall be noticed that further splitting to more than 2 parallel phases is actually easier than the splitting to the original 2 processing phases; because while one of the phases is active, its earlier subclocks can be used to trigger flip-flops which can segregate subclocks which belong to multiple other phases and can be used to drive the other parallel phases.

Consequently using this approach; allows increasing parallel stages processing times to multiples of local clock periods by using said DWS MSC multiphase processing which has been described above.

DTC comprises using fractional adjustments of synthesized clock phase for providing high resolution phase modifications by fractional parts of a local clock period.

DTC comprises applying combined periodical and fractional adjustments of synthesized clock phase, by using counters of local clock periods for generating counter end (CE) signals when periodical parts of such phase adjustment are expired.

DTC further comprises using said counter end signals for generation of control signals which assign and/or synchronize consecutive sets of sequential stages for processing consecutive periodical and/or fractional phase adjustments of the synthesized clock.

DTC comprises:

Using a basic periodical adjustment and a basic fractional adjustment for providing a basic phase step, which can remain the same for multiple edges of the synthesized clock.

Using a modulating periodical adjustment and a modulating fractional adjustment, which can be different for every specific edge of the synthesized clock.

Using said DWS MSC and SSP methods for processing of said basic periodical adjustments, basic fractional adjustments, modulating periodical adjustments and modulating fractional adjustments for calculating periodical and fractional parts of combined adjustments.

Processing such calculated combined adjustment and position of a previous edge of the synthesized clock for deriving periodical and fractional parts of the next edge position of the synthesized clock

BRIEF DESCRIPTION OF THE DRAWINGS

FIG. 1A, FIG. 1B and FIG. 1C are showing block diagrams of different implementations of the time processing technology.

FIG. 2A shows Frequency Response of the FIR Filter designed using Frequency Sampling Method.

FIG. 2B shows Rational Number Filter implementing this FIR Filter.

FIG. 2C shows Frequency Response of the IIR Filter of 1$^{st}$ order.

FIG. 2D shows Rational Number Filter approximating this IIR Filter.

FIG. 2E shows Impulse Response of the RNF approximating this IIR.

FIG. 3A shows block diagram of Time to Digital Converter (TDC).

FIG. 3B shows Detector of Fractional Phase (DFP).

FIG. 4 shows Block Diagram of Digital to Time Converter (DTC).

FIG. 4A shows Sequential Clocks Generator (SCG) and Output Selection Circuit (OSC), wherein the SCG generates the subclocks and the phase1/phase2 subclocks of LOC_Clk and the OSC selects a specific such phase1/phase2 subclock for implementing digital to time conversion defined by the real time sequential processor (RTSP).

FIG. 4B shows Clocks Equalization Circuit exemplifying system of buffers securing subclocks compliance with timing needed to implement the DTC and the time processing system.

FIG. 5A shows Detector of Initial Frame Phase (DIFP).

FIG. 5B shows Timing Starting Circuit (TSC) generating timing signals which control initial preloading of the sequential stages of the RTSP.

FIG. 5C shows Timing Control Circuit controlling operations of the RTSP.

FIG. 6 shows Real Time Sequential Processor (RTSP)
FIG. 7A shows Timing Diagram of the Sequential Clocks Generator (SCG).

FIG. 7B shows Timing Diagram of DTC Operations.

DETAILED DESCRIPTION

Principles of operations of the time processing systems defined above are illustrated below by showing utilization of FIR and IIR filters for the phase noise reduction.

The utilization of the FIR and IIR filters shown below may relate to a hypothetical OFDM system characterized as follows:

BW=~20 MHz, number of FFT points=2048, referencing frame (OFDM symbol) length=~100 µs, sampling frequency Fs=~20 MHz, sampling period Ts=~50 ns, time periods between consecutive subclocks defining phase measurement/phase synthesis steps Tsc=~50 ps.

Functioning of OFDM systems may be affected by:

OFDM signal phase drift or low frequency changes caused by factors such as changing geographic environment affecting signal fading or a frequency drift of the local clock;

higher frequency phase noise introduced to the referencing signal by factors such as inaccurate detection of OFDM symbol boundaries defining the referencing frame or interference of a noisy RF environment.

While such phase drift and low frequency changes shall be followed by the synchronous frame and clock, such higher frequency phase noise shall be reduced by filtering it out before the synchronous frame and sampling clock are produced.

1. Phase Tracking System

The phase tracking system is presented in FIG. 1B.

TDC utilizes the local clock or subclocks for measuring lengths of periods of the referencing frame.

TDC signals ends of the measured referencing frame periods (and availability of the measured lengths of the periods) to PCU.

PCU reads the measured lengths and derives lengths of following periods of the synchronous frame and the synchronous clock.

wherein the derivation of the lengths includes filtering out the phase noise contributed by the referencing frame.

Availability of a first such derived length of the synchronous frame and lengths of its clocks is signaled by PCU to DTC immediately after processing said measured length of an initial said referencing frame period.

However, the DTC starts using the first derived lengths of the synchronous frame and its clocks for producing a first period of the synchronous frame and periods of its clocks, only after detecting an end of a referencing frame period next to the initial referencing frame period.

After such initialization of DTC, PCU makes next the derived lengths available for reading by the DTC immediately after processing previous such measured lengths, but DTC reads and utilizes the next derived lengths for producing next the synchronous frame periods only after producing previous the synchronous frame periods.

An end phase of a first the synchronous frame period may be made equal to a penultimate such measured length of such referencing frame period or a more complex estimate such as an weighted average of plurality of the lengths of the referencing frame periods measured by TDC before the first synchronous frame period is produced.

All the following consecutive the measured lengths are filtered and utilized for deriving lengths of the synchronous frame periods constructing the synchronous frame which is tracking phase of the referencing frame without any accumulation of quantization errors.

Such TDC, PCU and DTC interactions shall satisfy timing relations explained below.

As differences between consecutive the measured lengths may be significant (e.g. ¼ of the measured lengths for OFDM), securing the availability of the measured lengths for the deriving the lengths of following synchronous frame periods may require a time amounting to a significant fraction of the synchronous frame periods next to the measured referencing frame periods.

The deriving the lengths, performed by the PCU, shall also require a time amounting to a fraction of the lengths of the next synchronous frame periods.

Therefore the producing the synchronous frame periods consisting of the synchronous clock periods, can be started only after a time delay sufficient to:

accommodate safely both the time required for the securing the availability of the measured lengths and the time required for the deriving the lengths of the next synchronous frame periods, before DTC can read and utilize the derived lengths for producing the next synchronous frame periods after the producing the previous synchronous frame periods.

In order to assure such safe accommodation of both time delays it is assumed herein that: every the measured lengths with the exception of following x(0) the second measured phase x(1), is used by PCU for the deriving the length of the synchronous frame period which begins after the synchronous frame period next to the measured one, the synchronous frame period y(2) is started at the end of the referencing frame period x(1) and its length is made equal to that of x(0).

The filtering out of the phase noise of the referencing frame is performed by PCU by utilizing FIR or IIR filters detailed further on.

It shall be noted that mentioned in SUMMARY OF THE INVENTION utilization of FIR and IIR filters for the phase noise reduction in such phase tracking systems, is covering applications of a wide variety of filters which are exemplified by but not limited to applications of FIR and IIR filters described below.

2. Implementations of RNF, OLS and CLS.

2.1 Rational Number Filter with Finite Impulse Response (RNF FIR).

The synchronous frame periods y(2), y(3), y(4), ... y(n−1), y(n) are tracking the referencing frame periods x(0), x(1), x(2), ... x(n−3), x(n−2).

Such phase tracking may include phase noise reduction implemented by passing time intervals containing pluralities the measured lengths x(0), x(1), x(2), ... x(n−3), x(n−2) through a low pass filter.

However the measured lengths can be treated as comprising:

a bigger constant component expected to be closer to non-distorted original phases of the referencing frame tracked actually;

significantly smaller variable components closer to a phase noise which is caused by transmission channel distortions and shall be filtered out.

In order to improve filtering efficiency only the variable components, defined by differences between consecutive the measured lengths and the expected constant component, are passed through the low pass filter.

Using such differences instead of entire the measured lengths reduces amount of processing needed to filter the phase noise out.

The expected constant component may be estimated as equal to a first such measured length x(0) or an average of the lengths measured initially.

It is assumed below that:

the expected constant component is equal to x(0);

the measured lengths differences are defined as equal to $$\Delta x(1)=x(1)-x(0), \Delta x(2)=x(2)-x(0), \ldots \Delta x(n-2)=x(n-2)-x(0);$$

the phase tracking is initialized at the end of x(1) by starting the original period produced by DTC as y(2)=x(0).

Consequently outputs of the low pass filter are supplying differences between entire derived lengths and the original derived length which are amounting to:

$$\Delta y(3)=y(3)-y(2), \Delta y(4)=y(4)-y(2), \ldots \Delta y(n)=y(n)-y(2).$$

Resulting phase tracking operation is based on using the measured lengths differences for deriving supplements of the original derived length y(2) needed to calculate the entire derived lengths of the synchronous frame periods y(n).

Such supplementation of the original length y(2) is accomplished by adding to it a noise filtering products of the measured lengths differences $\Delta x(2)$, $\Delta x(3)$, $\Delta x(n-2)$, wherein filter DC gain G(ω=0) has to be equal to 1 in order to enable accurate phase tracking without uncontrolled phase transients.

When a FIR filter is defined with coefficients h(0), h(1), ... h(k), the synchronous frame periods tracking phase of the referencing frame are derived as:

y(2)=x(0). wherein using such y(2) for an actual synchronous frame synthesis begins when the time to digital converter (TDC) detects the end of the x(1) period of the referencing frame;

y(3)=y(2), since x(2) and $\Delta x(2)$ are not available yet when a derivation of y(3) is conducted;

y(4)=y(2)+h(0)Δx(2);

y(5)=y(2)+h(0)Δx(3)+h(1)Δx(2);

and further on $$y(k+2+2)=y(2)+h(0)\Delta x(k+2)+h(1)\Delta x(k+1)+ \ldots + h(k-1)\Delta x(3)+h(k)\Delta x(2),$$

$$y(n)=y(2)+h(0)\Delta x(n-2)+h(1)\Delta x(n-3)+ \ldots +h(k-1)\Delta x(n-k-1)+h(k)\Delta x(n-k-2).$$

Consequently $$\Delta y(n)=h(0)\Delta x(n-2)+h(1)\Delta x(n-3)+ \ldots +h(k-1)\Delta x(n-k-1)+h(k)\Delta x(n-k-2).$$

The resulting transfer function of such FIR filter is presented below as:

$$\Delta X(z)/\Delta X(z)=z^{-2}(h(0)+h(1)z^{-1}+ \ldots +h(k-1)z^{-(k-1)}+h(k)z^{-k}).$$

Such FIR filter is designed below using a Frequency Sampling Method (FSM).

The FSM is described in Section 8.2.3 of the "Digital Signal Processing" by John Proakis and Dimitris Manolakis edited in 1996.

For exemplifying solutions claimed, the low pass filter of length M=15 with BW=1 and 2 Transition Coefficients equal to 0.590 and 0.095, have been chosen and designed with the Matlab program presented below.

N=15; k=0:N−1;

H=[1 0.590 0.095 0 0 0 0 0];

H=[H fliplr(H(2:end))];

H=H.*exp(−j*2*pi/N*(N−1)/2*k);

hlp2t=real(ifft(H));

hlp2t2i5f=round(hlp2t,5);

t=[k;hlp2t2i5f];

fprintf('%2i%1.6f\n',t);

Such program produced filter coefficients listed below:

h(0)=h(14)=0.001290,h(1)=h(13)=0.006940,h(2)=h(12)=0.021000,h(3)=h(11)=0.046050, h(4)=h(10)=0.080730,h(5)=h(9)=0.117980,h(6)=h(8)=0.147010,h(7)=0.158000.

The DC gain of such filter G(ω=0) is equal to the sum (h(0)+h(1)+ ... +h(13)+h(14))=1.

The frequency response of such filter shown in FIG. 2A was produced using the Matlab program:

[H,W]=freqz(hlp2t2i5f,1);

Hdb=mag2db(abs(H));

plot(W,Hdb)

Such FIR filter implementation using RNF method is shown in FIG. 2B and described below.

It is explained in "SUMMARY OF THE INVENTION" that the measured lengths are expressed with integer numbers and can be added without any accumulation of time quantization errors, in order to define any longer time interval containing a plurality of the referencing frame periods.

The differences Δx(n) defined using such measured lengths are integer numbers providing an accurate and complete base for the filter operations.

The RNF FIR shown in FIG. 2B is producing the difference estimate $\Delta y_{fil}(n)$ which may contain an integer part $\Delta y_{int}(n)$ and a fractional part $\Delta y_{fra}(n)$.

However DTC can introduce integer numbers only of the subclock periods to the lengths of the synchronous frame periods.

Such DTC limitation would cause accumulation of quantization errors if such fractional parts $\Delta y_{fra}(n)$ were disregarded.

Therefore the fractional parts $\Delta y_{fra}(n)$ are added instead to contents of the Modulo 1 Accumulator $\Delta y_{acc}(n-1)$ until such content becomes equal or greater than 1.

When it happens only a fractional part of such content is kept in the Modulo 1 Accumulator and 1 is added to $\Delta y_{int}(n)$ and y(2) in order to produce $y(n)=y(2)+\Delta y_{int}(n)+1$ expressed as an integer number.

Such elimination of quantization errors accumulation can be achieved for every FIR filter having limited number of coefficients expressed with rational numbers, by deriving a common denominator and expressing these coefficients with rational numbers having such common denominator.

All the coefficients of the FIR filter specified above, may be treated as rational numbers having the common denominator equal to $10^5$.

All this filter outputs, shown in FIG. 2A as $\Delta y_{fil}(n)=\Delta y_{int}(n)+\Delta y_{fra}(n)$, may be obviously presented as rational numbers having the same common denominator equal to $10^5$.

Consequently all the fractional parts of such outputs $\Delta y_{fra}(n)$ have the same denominator $10^5$ and can be accumulated using the Modulo 1 Accumulator until $\Delta y_{acc\_ovf}=1$ is produced and added to $\Delta y_m(n)$ and y(2) in order to prevent any accumulation of quantization errors.

The y(n) specifies the length of such synchronous frame period with an integer number of the subclocks of the local clock.

Since every synchronous frame period contains 2048 sampling clock periods, a length of every sampling clock period shall amount to s(n)=y(n)/2048.

Such s(n) can be presented as a rational number containing an integer part $s_{int}(n)$ and a fractional part $s_{fra}(n)$.

However DTC can use integer numbers only of the subclock periods for defining the lengths of the synchronous clock periods which it is producing.

Therefore the s(n) are rounded by:

adding the fractional part $s_{fra}(n)$ to consecutive contents of the Modulo 1 Accumulator (similar to that described above) corresponding to consecutive cycles of the sampling clock until such contents are becoming equal or greater than 1;

and when it happens, adding 1 to $s_{int}(n)$ in order to produce $s_{acc\_int}(n,i)=s_{int}(n)+1$ wherein index i indicates a sequential number of a particular sampling clock cycle within the synchronous frame period y(n).

The resulting sequence defining 2048 of such sampling clock cycles may be stored in a FIFO memory in PCU and downloaded gradually to DTC in reply to the LD_BU1 and LD_BU2 signals shown in FIG. 6, in order to produce i=1 to 2048 cycles of the sampling clock contained in the synchronous frame period y(n).

Methods covered by this invention include also downloading such sequence from PCU to a FIFO memory located in DTC equipped for utilizing content of such internal FIFO for producing the cycles of the sampling clock contained in corresponding the synchronous frame period.

2.2 Rational Number Filter Approximating Infinite Impulse Response (RNF IIR)

Principles of operations the RNF IIR are explained below as relating to approximations of IIR filters of $1^{st}$ and higher orders as well.

Such principles of operations are illustrated in the following subsection 2.2.1 showing their detailed implementation with the $1^{st}$ order IIR filter.

The measured length difference of the referencing signal frame $\Delta x_{del}(n)$ is applied to the filter input as an integer number $\Delta x_{del}(n)$ (see the subsection 2.2.1 and FIG. 2C).

The filter outputs $\Delta y(n)=\Delta y_{int}(n)+\Delta y_{fra}(n)$ are comprising both the integer and fractional components.

The fractional components $\Delta y_{fra}(n)$ can not be implemented by DTC and their application to recursive branches of an IIR filter would produce a sequence of such $\Delta y_{fra}(n)$ which could not be expressed with rational numbers using a limited set of integer denominators.

Such $\Delta y_{fra}(n)$ expressed with unlimited numbers of denominators could not be accumulated and utilized for driving the DTC in the way explained above for the FIR filter.

Therefore only the integer part of the filtered phase $\Delta y_{int}(n)$ is applied to DTC and the recursive branches of the filter.

Such omission of the the remaining fractional $\Delta y_{fra}(n)$ is equivalent to: a hypothetical subtracting of a part of of the present $\Delta x_{del}(n)$ corresponding to the $\Delta y_{fra}(n)$ from the entire $\Delta x_{del}(n)$ before applying the resulting quotient to the input of the filter which would consequently produce only the integer output $\Delta y_{int}(n)$.

The subtracted part of the $\Delta_{del}(n)$ corresponding to the $\Delta y_{fra}(n)$ is retained as $\Delta x_{del}(n)$ and added to next the $\Delta_{del}(n)$ in order to preserve filter DC gain (Gdc=G($\omega$=0)=1).

It shall be noted that:

such omission of $\Delta y_{fra}(n)$ is the only consequence of the subtraction of the corresponding part of $\Delta x_{del}(n)$, if and only if filters equation does not include any utilization of any delayed sample of $\Delta x_{del}(n)$;

however if such utilization of the delayed sample occurs, than the delayed sample is affected as well and it shall be amended by subtracting from it the $\Delta x_{ret}(n)$.

The resulting filter operates as a conventional IIR filter having LTI properties, but it is fed with $\Delta x_{del}$ modified by such subtracting of the $\Delta x_{ret}$ from the present $\Delta x_{del}$ and adding the same $\Delta_{ret}$ to the next $\Delta x_{del}$.

Such modifications of the $\Delta_{del}$ are affecting dynamic characteristics of the filter output but cannot change its DC gain.

Due to high resolution of the $\Delta x(n)$ produced by the TDC and corresponding to it $\Delta y(n)$ applied to and utilized by the DTC, resulting changes of the dynamic characteristics shall be insignificant.

Due to the LTI properties of such IIR filter, filters impulse response can be used for defining filter operations.

An analysis of the impulse response of such IIR filter (see FIG. 2E) shows that such omission, retaining and addition are continuing until $\Delta y_{int}(n)=0$ is reached and causes recursive branches to become inactive and returning zeroes.

When the $\Delta y_{int}(n)=0$ is settled, the same $\Delta x_{ret}$ is reapplied continuously and the same $\Delta y_{fra}$ would be circulated while $\Delta y_{int}(n)=0$ would be outputted by the filter.

Such ending of the impulse response would cause a granularity error of the filter to be equal to such settled $\Delta x_{ret}$ corresponding to the settled $\Delta y_{fra}$.

Although such granularity error is not cumulative, it can be multiple times greater than TDC or DTC quantization error.

Such granularity error multiple times greater than quantization error introduced to $\Delta x_{del}$ by TDC, may be reduced to a size of the TDC quantization error, by adding the integer part of the last applied $\Delta x_{ret}$ to filter output.

In order to reduce phase jitter, such addition may be distributed over time as it is exemplified in the Subsection 2.2.1 and FIG. 2C, wherein:

coefficient "a" is subtracted from $\Delta y_{fra}$ and 1 is added to every consecutive filter output $\Delta y(n)$, for as long as modulo $(\Delta y_{fra})$ is greater than or equal to "a";

wherein the subtracting of "a" from $\Delta y_{fra}$ is equivalent to subtracting 1 from $\Delta x_{ret}$, since $a\Delta x_{ret} = \Delta y_{fra}$ Such elimination of quantization errors accumulation can be achieved for every IIR filter using a limited number of coefficients expressed with rational numbers, by:

using these coefficients and integer input signal for deriving components of this filter equation expressed with rational numbers having common denominator determined by these coefficients;

preventing further multiplications of such rational numbers by recursive branches coefficients, by eliminating fractional parts of filter output signal (feeding the recursive branches) by modulating the input signal without changing filters DC gain.

Such transforming of the remaining fractional parts of the filtered phase into retained parts of the measured lengths differences and adding them to next filter inputs in order to compensate the remaining fractional parts later on, is influencing still dynamic characteristics of the phase filter.

However due to the high resolution of the TDC and DTC defined by the sub-clocks of the local clock, such influence on the dynamic characteristics shall be negligible.

2.2.1 Example of RNF Approximating IIR Filter.

For exemplifying solutions claimed, an implementation of a low pass $1^{st}$ order IIR filter is described first and the RNF approximating such IIR filter is presented next.

It is assumed that this IIR filter is using factor $a<<1$ to attenuate variable components of the phase differences in order to filter out phase noise contributed by the referencing signal.

Similarly as it is explained above in Sec. 2.1 it is assumed that:

the phase tracking is initialized at the end of x(1) by starting the original produced period y(2)=x(0);

the synchronous frame periods y(2), y(3), y(4), . . . y(n−1), y(n) are tracking the referencing frame periods x(0), x(1), x(2), . . . x(n−3), x(n−2);

$$\Delta x(1)=x(1)-x(0), \Delta x(2)=x(2)-x(0), \ldots \Delta x(n-2)=x(n-2)-x(0);$$

$$\Delta y(3)=y(3)-y(2), \Delta y(4)=y(4)-y(2), \ldots \Delta y(n)=y(n)-y(2).$$

Phase tracking deviations d(k) between x(k) and y(k) are estimated and utilized for deriving following them y(k+1) as it is shown below:

y(2)=x(0) wherein using such y(2) for an actual synchronous frame synthesis begins when the digital to time converter (DTC) detects the end of the x(1) period of the referencing frame, d(2)=x(2)−x(0)=$\Delta x(2)$,
y(3)=y(2);
d(3)=$\Delta x(3)$+$\Delta x(2)$,
y(4)=y(2)+a$\Delta x(2)$;
d(4)=$\Delta x(4)$+$\Delta x(3)$+(1−a)$\Delta x(2)$,
y(5)=y(2)+a$\Delta x(3)$+a(1−a)$\Delta x(2)$;
d(5)=$\Delta x(5)$+$\Delta x(4)$+(1−a)($\Delta x(3)$+(1−a)$\Delta x(2)$),
y(6)=y(2)+a($\Delta x(4)$+(1−a)($\Delta x(3)$+(1−a)$\Delta x(2)$)).
Consequently $$\Delta y(n)=a\Delta x(n-2)+(1-a)\Delta y(n-1).$$

The resulting transfer function of such IIR filter amounts to:

$$\Delta X(z)/AX(z)=az^{-2}/(1-(1-a)z).$$

Impulse response of such IIR filter is derived below.

When $\Delta x(2)=\Delta x_{imp}>0$ and $\Delta x(3)=\Delta x(4)= \ldots = \Delta x(n-1)=\Delta x(n)=0$:

$$\Delta y(2)=0$$

$$\Delta y(3)=0,$$

$$\Delta y(4)=a\Delta x(2)=a\Delta x_{imp},$$

$$\Delta y(5)=a\Delta x(3)+a(1-a)\Delta x_{imp}=(1-a)a\Delta x_{imp}$$

and finally $$\Delta y(n)=a\Delta x(n-2)+(1-a)\Delta y(n-1)=(1-a)^{n-4}a\Delta x_{imp}$$

The resulting sum is $$\Delta y(2)+\Delta y(3)+\Delta y(4)+ \ldots +\Delta y(n)=a\Delta x_{imp}(1+(1-a)+(1-a)^2 \ldots (1-a)^{n-4}),$$

and such sum converges to $a\Delta x_{imp}(1-(1-a)))=a\Delta x_{imp}(1/a)=\Delta x_{imp}$ when n converges to infinity.

Consequently this IIR filter has DC gain $G(\omega=0)$ equal to 1.

Frequency response of conventional implementation of such IIR filter using a=0.05, is shown in FIG. 2C.

Such conventional IIR filter would be expressed conventionally with the equation:

$$\Delta y(n)=a\Delta x_{del}(n)+(1-a)\Delta y(n-1)).$$

The RNF approximating this IIR filter is shown in FIG. 2D as comprising modifications explained below.

In order to omit the $\Delta y_{fra}(n)$ and apply only $\Delta y_{int}(n)$ to the output and recursive branch, the corresponding to it $\Delta x_{ret}(n)$ shall be treated as being subtracted from the $\Delta x_{del}(n)$ and it shall be added to a next $\Delta x_{del}(n)$ to compensate for this subtraction.

However such $\Delta x_{ret}(n)$ would equal to $\Delta y_{fra}(n)/a$ and adding it to the next $\Delta x_{del}(n)$ would be equivalent to increasing a next $\Delta y_{fil}(n)$ by $a\Delta x_{ret}(n)=a\Delta y_{fra}(n)/a=\Delta y_{fra}(n)$.

Such unneeded multiplication and division of $\Delta y_{fra}(n)$ by the same factor a, is avoided by the direct increasing of the next $\Delta y_{fil}(n)$ by $\Delta y_{fra}(n)$ shown in FIG. 2D.

Since this filter's forward branch coefficient equals to "a" and the recursive branch coefficient equals to "1-a", it's $\Delta x_{ret}(n)$ would always amount to an integer number if it were calculated.

Therefore the accumulation of fractional parts of $\Delta x_{ret}(n)$, mentioned in SUMMARY OF THE INVENTION, is not needed for this particular filter and not shown in FIG. 2D.

An analysis of the impulse response of such IIR filter shows that

Such omission of $\Delta y_{fra}(n)$ and increasing by it the next $\Delta y_{fil}(n)$ continues until $\Delta y_{int}(n)=0$ is reached and causes recursive branches to become inactive and returning zeroes.

When the $\Delta y_{int}(n)=0$ is settled, the same $\Delta y_{fra}$ would be reapplied continuously and the same $\Delta y_{int}=0$ would be outputted indefinitely by the filter.

Such ending of an impulse response of the filter would cause a granularity error of the filter to be equal to $\Delta x_{del}=\Delta y_{fra}/a$.

Due to the hypothetical $\Delta y_{fra}$ circulation continuing indefinitely, such granularity error would be noncumulative.

However it would be 1/a times greater than $\Delta x_{del}$ quantization error.

It is shown in FIG. 2D that such granularity error is reduced to the $\Delta x_{del}$ quantization error, by:

subtracting "a" from $\Delta y_{fra}$ and forcing every consecutive filter output $\Delta y(n)$ to 1, for as long as $\Delta y_{int}=0$ and modulo ($\Delta y_{fra}$) is greater than or equal to "a";

wherein the subtracting of "a" from $\Delta y_{fra}$ is equivalent to subtracting 1 from $\Delta x_{ret}$, since $a\Delta x_{ret}=\Delta y_{fra}$.

Impulse Response of the RNF BR shown in FIG. 2D and based on assumptions that $a=0.05$ and $\Delta x_{imp}(0)=50$, is detailed in FIG. 2E confirming achieving noncumulative filter quantization error lesser than that of the filter input $\Delta x_{del}$.

Thus this specification contributes elimination of accumulation of quantization errors of RNF approximating IIR filters, by delaying applications of parts of their input signal which are corresponding to fractional parts of their output signal.

2.3 Phase Transferring Using the CLS.

The implementation of CLS with the phase transferring configuration (PTC shown in FIG. 1C) replacing a VCO used conventionally with a cost lowering free running oscillator, has been introduced in SUMMARY OF THE INVENTION.

Both OLS RNF and CLS based PTCs can be implemented with the same hardware configuration presented in FIG. 1C.

The PTC implementing CLS comprises PCU programmed to initiate the phase transferring process by:

measuring a lengths of initial interval of the referencing signal $x(0)$ by subtracting a first phase captured by TDC1 from a second phase captured by TDC1 (as in OLS RNF based PTC);

driving DTC into presetting a length of the 2nd interval of SYN_FRA $y(2)$ to $x(0)$ and a length of the 3rd interval of SYN_FRA $y(3)$ to $x(0)$ as well (as in OLS RNF based PTC);

After the initialization the PCU programmed to implement CLS, shall:

measure phase errors $\Delta x_{err}(2), \ldots \Delta x_{err}(n-2)$ between the timing referencing signal REF_FRA and the timing implementing signal SYN_FRA, by subtracting a phase of the end of the number 2, ... (n−2) interval of SYN_FRA (supplied by Phase Reg.2 and named as $y_{end}(2), \ldots y_{end}(n-2)$) from a phase of the end of the number 2, ... (n−2) interval of REF_FRA accordingly (supplied by Phase Reg.1 and named as $x_{end}(2), \ldots x_{end}(n-2)$);

apply $\Delta x_{err}(2), \ldots \Delta x_{err}(n-2)$ to an input of a CLS filter (similarly as $\Delta x_{del}(2), \ldots \Delta x_{del}(n-2)$ are applied to RNF);

add outputs of the CLS filter $\Delta y_{fil}(2), \ldots \Delta y_{fil}(n-2)$ to the $y(2)$, in order to derive synthesized frame intervals $y(4)=y(2)+\Delta y_{fil}(2), \ldots y(n)=y(2)+\Delta y_{fil}(n-2)$ accordingly (similarly as in OLS RNF based PTC);

wherein the CLS filter shall be designed by using methods of digital control engineering known commonly (taught in books such as "Digital Control Engineering Analysis and Design" by Sami Fadali and Antonio Visioli and in the Chapter 6 of this book specifically);

apply the synthesized frame intervals $y(2)$, $y(3)$, $y(4), \ldots y(n)$ to the input of DTC which is using them for producing the synthesized clock and frame (SYN_Clk and SYN_FRA) from the subclocks of the free running local clock (LOC_Clk represented by the Clk0.1 in FIG. 1C).

2.4 Adaptive PTC Applications

The PTC hardware is defined by system presented in FIG. 1C.

Such PTC hardware may be driven by diversified software systems in order to create different PTC versions needed to satisfy requirements of diversified PTC applications.

Such different versions include but are not limited to PTC implementing OLS with performance monitoring & control described in Subsection 1B of SUMMARY OF INVENTION and PTC implementing CLS described above in Subsection 2.3.

In addition to the mentioned above PTC versions, such different versions defined by diversified software systems may include:

analysing frequency spectrum and/or other quality indicators of REF_FRA (by using the measured timing referencing intervals) and/or those of SYN_FRA (by measuring and using the timing implementing intervals of SYN_FRA);

adaptive changing of PTC operations to those performing different functions more suitable for satisfying said application requirements;

wherein such adaptive changing of PTC operations may include but is not limited to changing PTC operations by modifying RNF filter used or switching from implementing OLS with performance monitoring & control to the implementing of CLS.

Such software systems may be downloaded to PTC from an external memory and may perform such switchings on the fly during continuing PTC operations.

Thus the implementations of the diversified versions of PTC and changes of PTC functionality mentioned above, may be enabled by utilizing different software systems consisting of different codes and/or micro-codes for controlling PTC hardware.

3. Time to Digital Converter (TDC)

Block diagram of TDC is shown in FIG. 3A.

The Sequential Clock Generator detailed in FIG. 4A and Sec. 4 utilizes a ring oscillator for multiplying frequency of the oscillator clock (OSC_Clk) for producing the local clock (LOC_Clk) and its subclocks Clk0, Clk1, ... ClkR needed to secure high resolution of digital phase measurements.

Such subclocks Clk0, Clk1, ... ClkR occurring during every period of the local clock are used for producing subclocks 1Clk0, 1Clk1, ... 1ClkR/2Clk0, 2Clk1, ... 2ClkR occurring during odd/even periods accordingly of the local clock.

Such odd/even periods can be treated as belonging to phase 1/phase 2 accordingly of the local clock.

The subclocks 1Clk0, 1Clk1, ... 1ClkR/2Clk0, 2Clk1, ... 2ClkR are named as 1Clk(R:0)/2Clk(R:0) accordingly in FIG. 3A and FIG. 4.

The clock equalization circuit (CEC) shown in FIG. 4B exemplifies system of buffers designed to secure timing of the Clk(R:0).1 1Clk(R:0).1, 2Clk(R:0).1 defined by their prefixes and suffixes and corresponding to their functions.

When different loads are driven by the clocks, different sizes and numbers of buffers producing these clocks shall be utilized to achieve the timing defined in FIG. 3A, FIG. 3B and FIG. 5A, FIG. 5B, FIG. 7A, FIG. 7B.

Such equalization may be also needed for other clocks such as Clk0.1 shown in FIG. 3A.

For the sake of easier readability the common name Clk0.1 is used in FIG. 3A for signals driving DFP, SC and IPR, while in reality these signals may require an equalization in time by using different buffers securing sufficient time alignment to the original Clk0.1.

A detector of fractional phase (DFP) detailed in FIG. 3B uses 1Clk(R:0), 2Clk(R:0) for capturing accurate phase of a referencing frame (REF_FRA) signal activated when a boundary of the referencing frame occurs.

The splitting of the subclocks Clk0. Clk1, . . . ClkR into adjacent subsets 1Clk(R:0) and 2Clk(R:0) allows elimination of a dead zone condition explained below.

When the end of frame occurs and its phase is captured with 1Clk(R:0)/2Clk(R:0) during such odd/even period, the captured phase remains unchanged during following adjacent even/odd period.

Therefore this captured phase can be safely registered using ClkR−1.1 occurring during such following even/odd period and any occurrence of a dead zone can be avoided.

The DFP keeps sensing REF_FRA signal when TDC enable (TDC_ENA) signal sent by PCU is active.

PCU initiates entire process of time to digital conversion by activating TDC_ENA in a middle of a period of the referencing frame in order to avoid TDC_ENA interference with REF_FRA signal defining a boundary of the referencing frame.

When REF_FRA signal becomes active it keeps setting to 1 all consecutive bits of frame capture buffers FCB1(0:R) and FCB2(0:R) loaded by consecutive subclocks 1Clk-(0:R).1 and 2Clk(0:R).1.

When initially the bit R of a frame capture buffer of FCB1(0:R)/FCB2(0:R) is set to 1 by the subclock 1ClkR.1/2ClkR.1 accordingly, the bit R of next to it FCB2(0:R)/FCB1(0:R) accordingly remains reset for time period equal to Clk0.1 cycle equivalent to that of LOC_Clk cycle.

Therefore the signal FCB1_SEL/FCB2_SEL is selecting FCB1(0:R)/FCB2(0:R) to be loaded to frame capture register FCR(0:R) with the CLKR−1.1 following such initial setting of bit R by almost one cycle of Clk0.1 defining timing equivalent to that of LOC_Clk.

However such FCB1_SEL/FCB2_SEL is deactivated when the bit R of the FCB2/FCB1 accordingly is activated at the end of the following Loc-Clk cycle.

Therefore the 3:1 Selector will keep selecting the FCR(R:0) to be reloaded with its previous content and the FCR(0:R) will remain unchanged for as long as active REF_FRA and active TDC_ENA are supplying 1 s to consecutive bits of the FCB1 and FCB2.

Such content of FCR(0:R) is encoded into binary form by the selector R+1:1 SEL producing fractional phase number FPN(S:0) specifying a number of subclocks defining accurate time delay between preceding Clk0.1 (LOC_Clk) and the REF_FRA signal.

The R bit of FCR (FCRR) enables activation of the control flip-flop 1 (C_FF1) and load synchronous counter (LD_SC) signal with a falling edge of Clk0.1.

The LD_SC selects the synchronous counter (SC(K:0)) to be loaded to the integer phase register (IPR(K:0)) which supplies an integer number of local clock cycles, occurring between consecutive detections of reference frame boundaries, to PCU.

The C_FF1 enables activation of the control flip-flop 2 (C_FF2) with the next falling edge of the Clk0.1 and generation of the read request (RD_REQ) signal; which are:

deactivating the C_FF1 and the LD_SC signal in order to preserve content of the IPR supplying to PCU an increased by 2 number of Clk0.1 cycles counted with the synchronous counter (SC(K:0)) before the REF_FRA activation;

loading the FPN(S:0) to the fractional phase register (FPR(S:0)) supplying a number of subclocks occurring between the last activation of Clk0.1 and the activation REF_FRA signal;

signaling to PCU that the IPR(K:0) and the FPR(S:0) shall be read.

PCU replies to the RD_PHA by deactivating TDC_ENA signal for a time interval lasting several cycles of LOC_Clk.

The deactivated TDC_ENA is resetting FCR(R:0) and C_FF2 in order to prepare for correct capturing of the next edge of REF_FRA.

4. Digital to Time Converter (DTC)

DTC outlined in Sec.3 of SUMMARY OF INVENTION is shown in FIG. 4, FIG. 4A-B, FIG. 5A-C, and FIG. 6. The timing diagram of DTC operations is shown in FIG. 7B.

The Block Diagram of DTC is shown in FIG. 4.

The Detector of Initial Frame Phase (DIFP) (detailed in FIG. 5A) utilizes sequential subclocks of LOC_Clk for capturing phase of REF_FRA with resolution matching single subclock delay, in order to enable accurate DTC initialization by the real time event presented by the appearance of an edge of REF_FRA signaling the end of x(1).

The Timing Starting Circuit (TSC) (detailed in FIG. 5B) is activated by SC_ACT and it synchronizes DTC startup by assigning timing steps needed to secure correct initialization of consecutive stages of the real time sequential processor (RTSP) with timely delivered phase adjustments supplied by PCU with signals PN1, FN1 and PN2, FN2.

The Timing Control Circuit (TCC) (detailed in FIG. 5C) is activated by signals S1E, S2E, and it produces signals LD_BU1, LD_BU2 securing timely delivery and downloading of the phase adjustments and signals controlling processing of the phase adjustments by the RTSP stages.

The RTSP (detailed in FIG. 6) is controlled by signals generated by TCC and it produces: signals C1E/C2E communicating to TCC that processing of consecutive such phase adjustment by RTSP's phase1/phase2 accordingly has been ended;

signals 1CS(R:0)/2CS(R:0) designed to select subclocks belonging to LOC_Clk's phase1/phase2 accordingly as those implementing the phase adjustments programmed by PCU.

The Output Selection Circuit (OSC) (detailed in FIG. 4A) is using such 1CS(R:0)/2CS(R:0) for such selection of these subclocks and for outputting the selected subclocks as the SYN_Clks.

The Sequential Counter Modulo 2048 and the Selector of Frame Boundary Clock are selecting every $2048^{th}$ SYN_Clk as signaling an end of SYN_FRA.

DTC operations described herein are explained and confirmed additionally by timing diagrams of SCG and DTC shown in FIG. 7A and FIG. 7B accordingly.

It shall be noted that:

all the selectors shown in the drawings presented herein are using a most top active selecting signal for selecting a corresponding (looking from the left) input signal, while all the next selecting signals are disabled by the most top active selective signal;

when all selecting signals shown are inactive (and none of corresponding to them input signals is selected), the last (looking from the left) input is selected even if choosing it selecting signal is not shown.

The DTC uses the same Sequential Clocks Generator (SCG) (shown in FIG. 4A and FIG. 7A) as the TDC (described above in Sec.3).

Such SCG produces subclocks of the local clock (LOC_Clk) by implementing the odd/even phase generator (mentioned above in Sec.3 of SUMMARY OF THE INVENTION); wherein:

the reference propagation circuit is implemented as the ring oscillator multiplying frequency of the local oscillator clock (OSC_Clk) by factor of L and producing local clock subclocks Clk(R:0);

the serially connected flip-flops driven by the subclocks Clk(R:0), are shown as producing signals PR(R:0), PR(R:0)N;

the odd/even selector is shown as using the signals PR(R:0), PR(R:0)N for producing subclocks 1Clk(R:0)/2Clk(R:0) activated during odd/even cycles of the local clock (LOC_Clk) accordingly.

Since the frequency multiplication (applied optionally to enable more efficient operations of the phase tracking system) maintains fixed relation of the local clock to the free running oscillator clock, the local clock shall be considered to be free running as well.

The same subclocks 1Clk(R:0), 2Clk(R:0) are used by TDC1 & TDC2/DTC for measuring/synthesizing phase of the referencing frame (REF_FRA)/synthesized frame & synthesized clock (SYN_FRA&SYN_Clk) accordingly (see FIG. 1B and FIG. 1C).

Similarly as it has been explained for TDC, the subclocks generated by SCG may need to be equalized by circuits exemplified in FIG. 4B in order to maintain timing defined by the ring oscillator outputs Clk0, Clk1, . . . ClkR-1, ClkR.

Output Selection Circuit (OSC) shown in FIG. 4A uses the clock selection signals 1CS(R:0)/2CS(R:0 produced by the $1^{st}$ clock selector (1CS)/$2^{nd}$ clock selector (2CS) shown in FIG. 6 for selecting one of the subclocks 1Clk(R:0)/2Clk(R:0) accordingly for producing the synthesized clock (SYN_Clk).

In order to improve resolution to better than that of LOC_Clk cycle, more accurate timing of REF_FRA is measured using a detector of initial frame phase (DIFP) shown in FIG. 5A.

The DFIP operates similarly as the DFP shown in FIG. 3B and described in the Sec. 3 presented above.

PCU enables DIFP operations starting entire process of digital to time conversion, by activating DTC_ENA in a middle of a period of the referencing frame, in order to avoid DTC_ENA interference with REF_FRA signal defining timing of a boundary of the referencing frame.

Such REF_FRA keeps setting to 1 all consecutive bits of frame capture buffers FCB1(0:R) and FCB2(0:R) loaded by consecutive subclocks 1Clk(0:R).1 and 2Clk(0:R).1.

When initially the bit R of a frame capture buffer of FCB1(0:R)/FCB2(0:R) is set to 1 by the subclock 1ClkR.1/2ClkR.1 accordingly, the bit R of next to it FCB2(0:R)/FCB1(0:R) remains reset for time period equal to LOC_Clk cycle.

Therefore the signal FCB1 SEL/FCB2 SEL keeps selecting FCB1(0:R)/FCB2(0:R) to be loaded to frame capture register FCR(0:R) by CLKR-1.1 (following such initial setting of bit R), by almost one cycle of LOC_Clk.

Content of FCR(0:R) remains unchanged for as long as both DTC_ENA and REF_FRA are active.

The DTC_ENA and REF_FRA can be deactivated after deactivation of the S2E signal only, wherein the S2E indicates that RTSP stages are not pre-loaded yet and FCR(0:R), FN(S:0) shall not be changed yet.

Content of FCR(0:R) is encoded into binary form by the selector R+1:1 SEL producing FN(S:0) specifying number of a subclocks defining accurate time delay between preceding LOC_Clk and REF_FRA signal.

The R bit of FCR (FCRR) is used to set starting counter activation (SC_ACT) signal with the falling edge of ClkR.1.

The SC_ACT is used to initiate DTC startup operations which are needed for pre-loading multiple stages of the real time sequential processor (RTSP) shown in FIG. 6 before any derivation and generation of the synthesized clock (SYN_Clk) may begin.

Such SC_ACT initiates the timing starting circuit (TSC) shown in FIG. 5B by setting S2E signal with the Clk1.1 (which is timing majority of other DTC operations as well).

The setting of S2E enables starting counter (SC) to identify starting steps 0 to 5 needed to define S1E and S2E signals driving timing control circuit (TCC) during DTC startup operations.

The TCC is shown in FIG. 5C and its timing is shown in FIG. 7B.

S2E activates load counter 1 (LD_C1) signal and enables activation of load register 1 (LD_RE1) signal by following Clk1.1.

LD_C1 loads periodical number register 1 (PNR1) to periodical counter 1 (PC1) (see FIG. 6).

LD_RE1 loads periodical number buffer 1 (PNB1) to periodical number register 1 (PNR1) (see FIG. 6).

LD_C1 is deactivated instantly when the LD_RE1 is activated.

S1E is activated by one cycle later than S2E when the SC is switched from SC=0 to SC=1.

S1E activates load counter 2 (LD_C2) signal and enables activation of load register 2 (LD_RE2) signal by following Clk1.1.

LD_C2 loads periodical number register 2 (PNR2) to periodical counter 2 (PC2).

LD_RE2 loads periodical number buffer 2 (PNB2) to periodical number register 2 (PNR2).

LD_C2 enables deactivation of the LD_RE1 and activation of load buffer 1 (LD_BU1) signal, by Clk1.1.

LD_BU1 loads periodical number 1 (PN1) supplied by PCU to PNB1 (see FIG. 6).

LD_C2 is deactivated instantly when the LD_RE2 is activated.

Such interactions between the S2E, LD_C1, LD_RE1 and S1E, LD_C2, LD_RE2 are repeated during the DTC startup, until PNB1, PNR1, PC1 and PNB1, PNR1 are preloaded from PCU with content defining positioning of SYN_Clk edges.

At the end of the startup, LD_C1 signal enables downloading to PC1 a number of periods which the previous stages of the RTSP have calculated for the current phase adjustment.

Such downloading activates counter 1 end (C1E) signal if a downloaded value is equal to 1.

When said downloaded value is bigger than 1, the C1E=0 causes generation of P1EN=1 signal which enables decreasing the PC1 content by 1 by Clk1.1 until the PC1=1 condition is detected by the PC1=1 Detector producing C1E=1 signal.

After such startup, the C1E and counter 2 end (C2E) signals are generated alternately as indicating that programmed by PCU numbers of LOC_Clk cycles specifying positioning of consecutive edges of SYN_Clk have expired.

Such C1E/C2E signals are driving TCC in the same way as S1E/S2E accordingly, as it is shown in FIG. 5C, FIG. 6 and FIG. 7B.

TCC produces also synthesis preparation (SYN_PRE) signal indicating to RTSP that DTC has not been prepared to produce correct SYN_Clk yet and specific RTSP functions need to be disabled or modified still to prevent generation of redundant or erroneous pulses of SYN_Clk.

Such SYN_PRE is activated by RESET signal and deactivated by LD_BU2.

The real time sequential processor (RTSP) shown in FIG. 6 implements the DWS MSC method explained in Sec.3 of SUMMARY OF INVENTION.

In order to allow higher frequencies of time signaling waveforms/eliminate dead zones in time synthesizing circuits, sequential processing stages/parallel processing phases are utilized for deriving/implementing accordingly phases of consecutive edges of the synthesized clock.

In order to facilitate processing of consecutive timing data programmed by PCU and supplied as sequence of PN1+FN1 alternating in time with PN2+FN2, said sequential processing stages are implemented as PC1, PNR1, PNB1 and PC2, PNR2, PNB2 timed by the signals detailed above.

In order to secure real time operations, all timing of SYN_Clk programmed by PCU is generated as related to the real time event signaled with the REF_FRA which causes initialization of the startup process.

It can be seen in FIG. 7B that such initialization and startup operations are adding a delay of 8 cycles of LOC_Clk to that defined by the first PN1(P:0) for the first generated SYN_Clk.

Since fractional time delay between preceding LOC_Clk and REF_FRA signal is specified by the FN(S:0), actual time delay between REF_FRA and following it LOC_Clk amounts to 1−FN(S:0). Such 1−FN(S:0) delay is taken into account by:
including 1 LOC_Clk delay into the 8 cycles delay specified above;
adding FN(S:0) to FN1(S:0) as it described below.

Another delay of 2 cycles is added inherently during splitting to different parallel phases, when clock selection register 1 (CSR1) or clock selection register 2 (CSR2) is loaded with content of fraction selection register (FSR(INH,S:0)) and actual clock selection is implemented (see detailed description further below).

In order to apply timing started by REF_FRA and defined by PCU to SYN_Clk generation, the SYN_PRE active at the beginning of startup operations is selecting:
PN1(P:0)−10 to be loaded to PNB1(P:0);
FN1(S:0)+FN(S:0) to be loaded to FNB1(OVF,S:0).

The SYN_PRE is also applied to PC1=1 Detector/PC2=1 Detector in order to inhibit any activation of signal C1E/C2E during startup independent of any actual content of PC1/PC2 accordingly.

Furthermore the SYN_PRE is used to enforce FNR(ICS) in order to prevent LD_C1 from enabling premature generation of erroneous SYN_Clk.

After being loaded by LD_BU1/LD_BU2 signals, fractional number buffers FNB1/FNB2 are merged into fractional number signal FNS(OVF,S:O) using 3:1 selector controlled by selecting fractional number SEL_FN1/SEL_FN2 signals generated by TCC shown in FIG. 5C.

The SEL_FN1/SEL_FN2 is activated for a period equal to LOC_Clk cycle when Clk0.1 encounters active LD_C1/LD_C2 signal accordingly (see FIG. 7B).

The FNS(OVF,S:O) is loaded into fractional number register FNR(OVF,S:0) with LD_RE signal activated by LD_RE1 or LD_RE2 for a period longer than half of LOC_Clk cycle.

The FNR(OVF) indicating that FNR content accumulated during previous operations exceeds fractional value and amounts to 1+FNR(S:0), is adding 1 to a content of PNR1/PNR2 before such increased content is downloaded to PC1/PC2 accordingly.

It is assumed that P:0 range is sufficient to avoid any overflow caused by such addition.

The FNR(S:0) is combined with inhibiting clock selection signal FNR(ICS) described below, before being loaded to fractional selection register FSR(ICS,S:0) by Clk1.1.

The FNR(ICS) is designed to prevent generation of redundant edges of SYN_Clk, as it is deactivated only when LD_C1 or LD_C2 occurring after DTC start-up are signaling that phases of edges of SYN_Clk are derived already.

Such deactivation of FNR(ICS) by LD_C1/LD_C2 is prevented by SYN_PRE/S2E signal indicating that this LD_C1/LD_C2 is generated during pre loading of PC1, PNR1, PBU1/PC2, PNR2, PBU2 accordingly during DTC start-up and phase of an initial edge of SYN_Clk is not derived yet.

The FNR(ICS) is supplementing FNR(S:0) in order to construct FNR(ICS,S:0) which is loaded to Fractional Selection Register (FSR(ICS,S:0) specifying number of a subclock of LOC-Clk which will define phase of next edge of SYN_Clk.

The clock selection registers CSR1/CSR2 are loaded with a current content of the FSR.

The CSR1/CSR2 specifies a subclock which will be selected in a forthcoming Phase1/Phase2 by a clock selector 1CS(R:0)/2CS(R:0) accordingly by decoding (S:0) binary code and activating its corresponding R:0 output if this CSR1(ICS)/CSR2(ICS)=0.

In order to avoid any dead zone and keep clocks selector 1CS(R:0)/2CS(R:0) settled during a whole next cycle of LOC_Clk, CSR1/CSR2 registers are loaded by the early subclock 2Clk0.1/1Clk0.1 of the first following Phase2/Phase1 accordingly of LOC-Clk In order to secure SYN_FRA timing programmed by PCU, the first SYN_FRA having lengths defined by y(2), shall be initialized exactly at the end of x(1) interval of REF_FRA.

It is described above how such exact timely initialization is secured with DIFP, by using it for:
detecting the end of x(1) interval;
measuring a delay between the end of x(1) and following it cycle of Clk1.1 timing operations of RTSP, as equal to 1-FN(S:0);
initiating RTSP to produce the first SYN_FRA interval defined by y(2) amended by subtracting from it the measured delay.

However solutions based on using the PTC shown in FIG. 1C are including also using TDC2 for simplifying DTC described above by eliminating DFIP.

Such elimination of DFIP can be achieved by supplementing PCU circuit and program functions with:
initiating DTC to produce the first SYN_FRA interval defined by y(2), when RD_REQ signaling the end of x(1) is received;
measuring time delay between the phase of the end of x(1) supplied in Phase Reg.1 and the phase of the end of such first SYN_FRA interval supplied in Phase Reg.2;
deriving delay of the RTSP initialization by subtracting the y(2) from the measured time delay; amending length of y(4) interval by subtracting from it the derived delay.

CONCLUSION

In view of the above description of the invention and associated drawings, other modifications and variations will now become apparent to those skilled in the art based on the teachings contained herein. Such other modifications and variations fall within the scope and spirit of the present invention.

What is claimed is:

1. A Time Processing (TP) method using a closed loop system (CLS) comprising a digital to time converter (DTC) fed with subclocks of a free running local clock, for filtering out a phase noise of a timing referencing frame defined with a known number of timing referencing clocks and producing a timing implementing frame defined with a number of timing implementing clocks corresponding to the known number of the timing referencing clocks; wherein the TP method comprises the steps of:
   generating the subclocks of the free running local clock by using a ring oscillator phase locked to a free running oscillator;
   measuring intervals of the timing referencing frame with the subclocks of the free running local clock by using a first time to digital converter (TDC1) and using the measured intervals of the timing referencing frame as reference inputs of the CLS;
   measuring intervals of the timing implementing frame with the subclocks of the free running local clock by using a second time to digital converter (TDC2) and using the measured intervals of the timing implementing frame as return inputs of the CLS;
   deriving differences between the reference and return inputs and passing the derived differences through a CLS filter designed to secure a low pass phase filtering by the CLS;
   applying outputs of the CLS filter to the DTC which uses the subclocks of the free running local clock for defining phases of the timing implementing frame and clocks.

2. A TP method as claimed in claim 1; wherein:
   the TDC1 is capturing phases of edges delimiting the intervals of the timing referencing frame with odd/even sets of the subclocks belonging to odd/even accordingly cycles of the local clock and the TDC1 is downloading the phases captured by the TDC1 with the odd/even sets of the subclocks by using the subclocks belonging to next even/odd accordingly sets of the subclocks;
   the intervals of the timing referencing frame are measured by using the phases downloaded by the TDC1;
   the TDC2 is capturing phases of edges delimiting the intervals of the timing implementing frame with the odd/even sets of the subclocks belonging to the odd/even accordingly cycles of the local clock and the TDC2 is downloading the phases captured by the TDC2 with the odd/even sets of the subclocks by using the subclocks belonging to next even/odd accordingly sets of the subclocks;
   the intervals of the timing implementing frame are measured by using the phases downloaded by the TDC2.

3. A TP method as claimed in claim 1; wherein the defining the phases of the timing implementing frame and clocks includes the steps of:
   producing odd/even sets of the subclocks of the local clock belonging to odd/even accordingly cycles of the local clock;
   pre-loading registers, used for selecting the subclocks belonging to next the odd/even sets of the subclocks, with phases defining the intervals of the timing implementing frame and clocks, by using the subclocks belonging to current the even/odd accordingly sets of the subclocks;
   producing the timing implementing frame and clocks by utilizing the pre-loaded registers for introducing the defined intervals to the timing implementing frame and clocks by the selecting the subclocks belonging to the next odd/even sets of the subclocks.

* * * * *